US010032661B2

(12) United States Patent
Chuang et al.

(10) Patent No.: US 10,032,661 B2
(45) Date of Patent: Jul. 24, 2018

(54) SEMICONDUCTOR DEVICE, METHOD, AND TOOL OF MANUFACTURE

(71) Applicant: Taiwan Semiconductor Manufacturing Company, Ltd., Hsin-Chu (TW)

(72) Inventors: Meng-Je Chuang, Hsin-Chu (TW); Yu-Lin Sung, Taoyuan (TW); Yi-Wei Chiu, Kaohsiung (TW); Tzu-Chan Weng, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/356,419

(22) Filed: Nov. 18, 2016

(65) Prior Publication Data

US 2018/0144970 A1 May 24, 2018

(51) Int. Cl.

| | |
|---|---|
| ***H01L 21/00*** | (2006.01) |
| ***H01L 21/683*** | (2006.01) |
| ***H01L 21/687*** | (2006.01) |
| ***H01L 21/67*** | (2006.01) |
| ***H01L 21/8238*** | (2006.01) |
| ***H01L 21/3213*** | (2006.01) |
| ***H01L 29/66*** | (2006.01) |

(52) U.S. Cl.

CPC .... *H01L 21/6833* (2013.01); *H01L 21/32136* (2013.01); *H01L 21/67069* (2013.01); *H01L 21/68735* (2013.01); *H01L 21/68742* (2013.01); *H01L 21/68757* (2013.01); *H01L 21/823821* (2013.01); *H01L 21/823828* (2013.01); *H01L 29/66545* (2013.01)

(58) Field of Classification Search

None

See application file for complete search history.

(56) References Cited

U.S. PATENT DOCUMENTS

| | | | |
|---|---|---|---|
| 5,900,064 | A | 5/1999 | Kholodenko |
| 6,108,189 | A | 8/2000 | Weldon et al. |
| 6,284,093 | B1 | 9/2001 | Ke et al. |
| 6,344,105 | B1 | 2/2002 | Daugherty et al. |
| 6,391,787 | B1 | 5/2002 | Dhindsa et al. |
| 7,758,764 | B2 | 7/2010 | Dhindsa et al. |
| 7,837,827 | B2 | 11/2010 | Dhindsa et al. |
| 8,342,121 | B2 | 1/2013 | Koshimizu |
| 8,500,953 | B2 | 8/2013 | Chang et al. |
| 9,017,526 | B2 | 4/2015 | Singh et al. |
| 9,137,884 | B2 | 9/2015 | Vinogradov et al. |
| 9,337,003 | B2 | 5/2016 | Murakami et al. |
| 9,385,219 | B2 | 7/2016 | Yieh et al. |
| 9,406,535 | B2 | 8/2016 | Berry, III et al. |

(Continued)

*Primary Examiner* — Reema Patel

(74) *Attorney, Agent, or Firm* — Slater Matsil, LLP

(57) ABSTRACT

A semiconductor device, method, and tool of manufacture includes a semiconductor manufacturing tool. The semiconductor manufacturing tool includes push pins in a chuck and an edge ring over the chuck. The push pins are configured to hold a wafer, and are operable to vary a height of the wafer with respect to the chuck. The edge ring has a first width at a base proximate the chuck, and a second width at a point distal the chuck. The first width is greater than the second width. A distance from the wafer to the edge ring varies when the push pins vary the height of the wafer with respect to the chuck.

20 Claims, 27 Drawing Sheets

10
12
14
$D_1$
$W_1$

(56) References Cited

U.S. PATENT DOCUMENTS

| | | | |
|---|---|---|---|
| 9,515,166 | B2 | 12/2016 | Nemani et al. |
| 9,852,889 | B1 | 12/2017 | Kellogg et al. |
| 2004/0092128 | A1* | 5/2004 | Grant ................ H01L 21/31111 438/745 |
| 2007/0032081 | A1 | 2/2007 | Chang et al. |
| 2008/0020574 | A1 | 1/2008 | Marakhtanov et al. |
| 2008/0170842 | A1* | 7/2008 | Hunter .............. H01L 21/67115 392/416 |
| 2011/0011534 | A1 | 1/2011 | Dhindsa |
| 2011/0126984 | A1 | 6/2011 | Kang et al. |
| 2014/0110785 | A1* | 4/2014 | Jagannathan ........... H01L 29/78 257/347 |
| 2014/0235063 | A1 | 8/2014 | McMillin et al. |
| 2016/0300725 | A1* | 10/2016 | Ambati ............. H01L 29/66795 |

* cited by examiner 128
126
108
106
102
104
100
122
120

SEMICONDUCTOR DEVICE, METHOD, AND TOOL OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
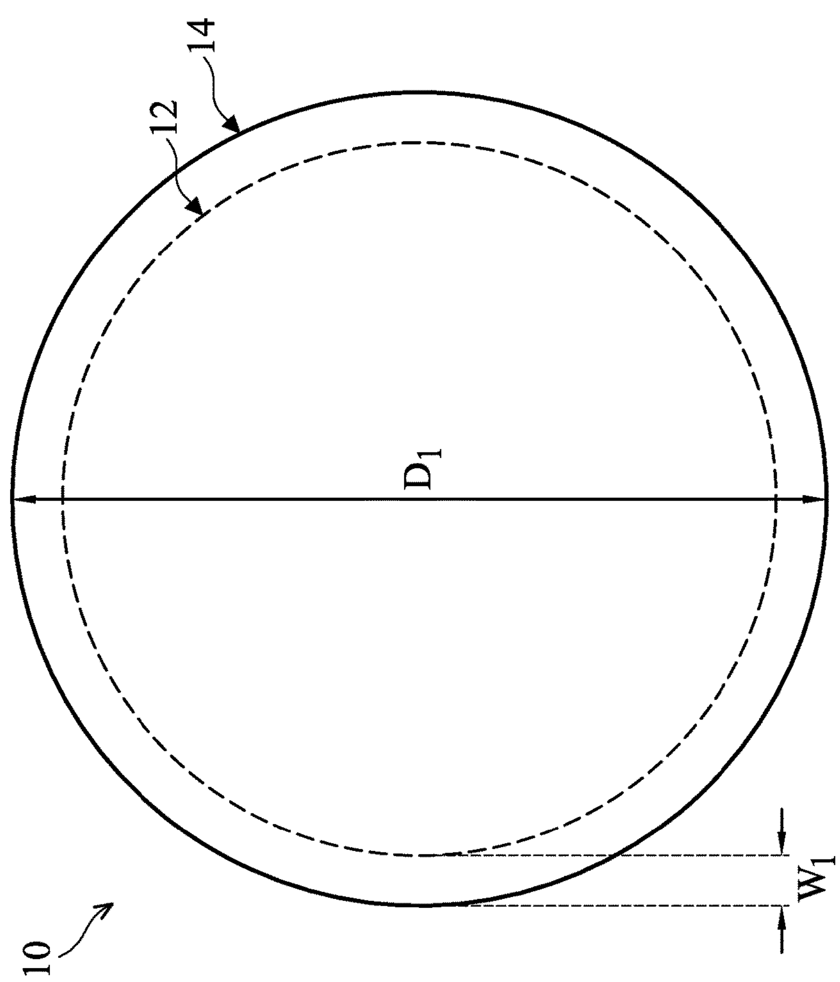
FIG. 1 shows a top-down view of a semiconductor wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices, methods, and tools of manufacture are described in accordance with various embodiments. In particular, the tool of manufacture may be an etch chamber with an edge ring that contains a wafer being processed. The edge ring is graded to have different steps that have different heights and are coated with different materials. Grading the edge ring with different steps and materials allows a difference in etch rate between the edge and the center of the wafer to be controlled during etching. Controlling the etch rate of the edge region of a wafer may allow a more uniform etching profile to be achieved across the wafer, reducing the difference in total height etched between the central region and the edge region of a wafer.

FIG. 1 shows a top-down view of a semiconductor wafer 10. The semiconductor wafer 10 may be viewed as having a central region 12 and an edge region 14. These regions are indicated as being separate from each other in FIG. 1 by the dashed circle, although no such circle is readily apparent in an actual product.

The edge region 14 of the semiconductor wafer 10 may be a region that is potentially affected by an edge ring (not shown in FIG. 1, but discussed below) used to contain the semiconductor wafer 10 during an etching process. For example, in an embodiment in which the semiconductor wafer 10 as a whole has a diameter that is a first distance $D_1$ from about 200 mm to about 450 mm, such as about 300 mm, the edge region 14 may have a first width $W_1$ from about 2 mm to about 4 mm, such as about 3 mm. Other embodiments may have other diameters or widths; for example, in an embodiment, the edge region 14 may be up to about 40% of the diameter of the semiconductor wafer 10. Reactants used to etch the semiconductor wafer 10 may react with a surface material or coating of the edge ring. For example, a material of the edge ring may act as a solid phase catalyst that causes some of the etching reactants to recombine at the edge region 14. Recombined etchants may not etch the semiconductor wafer 10, reducing the edge rate at the edge region 14. Varying the material or coating of the edge ring and the distance between the edge ring and the semiconductor wafer 10 allows the etch rate of the edge region 14 to be varied with respect to the etch rate of the central region 12.

Figure 2:
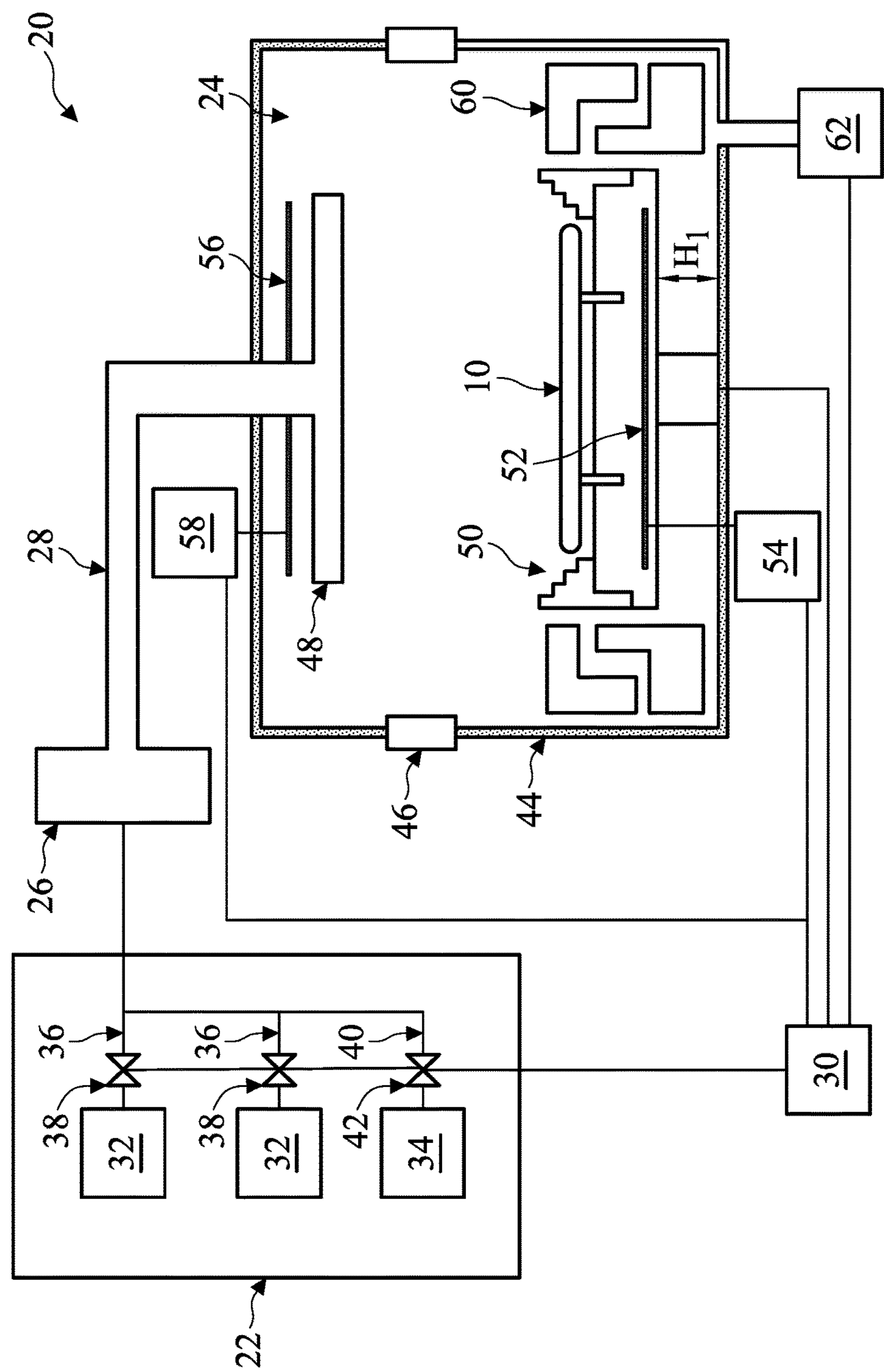
FIGS. 2 through 4B are various views of an etching system, in accordance with some embodiments.

FIG. 2 shows a start of a process to etch a surface of the semiconductor wafer 10 by placing the semiconductor wafer 10 into an etching system 20. In an embodiment the etching system 20 includes an etchant delivery system 22 that may deliver one or more gaseous etchants to an etching chamber 24. The etchant delivery system 22 supplies the various desired etchants to the etching chamber 24 through an etchant controller 26 and a manifold 28. The etchant delivery system 22 may also help to control the flow rate of the etchant or etchants into the etching chamber 24 by controlling the flow and pressure of a carrier gas through the etchant delivery system 22. The etchant delivery system 22 and the etching chamber 24 are controlled by a controller 30, which controls and regulates the introduction of various etchants and carrier gases to the etching chamber 24. In an embodiment, the etching system 20 may be an Applied Material Frontier™ chamber.

In an embodiment the etchant delivery system 22 may include a plurality of etchant suppliers 32 along with a carrier gas supply 34. Although only two of the etchant suppliers 32 are illustrated in FIG. 2, this is done merely for clarity, and it should be appreciated that any suitable number of etchant suppliers 32 may be included, such as one etchant supplier for each etchant desired to be used within the etching system 20. For example, in an embodiment in which five separate etchants will be utilized, there may be five of the etchant suppliers 32.

Each of the etchant suppliers 32 may be a vessel, such as a gas storage tank, that is located either locally to the etching chamber 24 or remotely from the etching chamber 24. In another embodiment, the etchant suppliers 32 may be part of a facility that independently prepares and delivers the desired etchants. Any suitable source for the desired etchants may be utilized as the etchant suppliers 32, and all such sources are fully intended to be included within the scope of the embodiments. Each of the etchant suppliers 32 supply an etchant to the etchant controller 26 through first lines 36 with first valves 38. The first valves 38 are controlled by the controller 30.

A carrier gas supply 34 may supply a desired carrier gas, or diluent gas, that may be used to help push or "carry" the various desired etchants to the etching chamber 24. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may be utilized.

The carrier gas supply 34, or diluent supply, may be a vessel, such as a gas storage tank, that is located either locally to the etching chamber 24 or remotely from the etching chamber 24. In another embodiment, the carrier gas supply 34 may be a facility that independently prepares and delivers the carrier gas to the etchant controller 26. Any suitable source for the carrier gas may be utilized as the carrier gas supply 34, and all such sources are fully intended to be included within the scope of the embodiments. The carrier gas supply 34 may supply the desired carrier gas to the etchant controller 26 through a second line 40 with a second valve 42 that connects the carrier gas supply 34 to the first lines 36. The second valve 42 is also controlled by the controller 30 that controls and regulates the introduction of the various etchants and carrier gases to the etching chamber 24. Once combined, the lines may be directed towards the etchant controller 26, for a controlled entry into the etching chamber 24 through the manifold 28.

The etching chamber 24 may be any desired shape that may be suitable for dispersing the etchant and contacting the etchant with the semiconductor wafer 10. In the embodiment illustrated in FIG. 2, the etching chamber 24 has a cylindrical sidewall and a bottom. However, the etching chamber 24 is not limited to a cylindrical shape, and any other suitable shape, such as a hollow square tube, an octagonal shape, or the like, may be utilized. Furthermore, the etching chamber 24 may be surrounded by an etchant chamber housing 44 made of material that is inert to the various process materials. As such, although the etchant chamber housing 44 may be any suitable material that can withstand the chemistries and pressures involved in the etching process, in an embodiment the etchant chamber housing 44 may be steel, stainless steel, nickel, aluminum, alloys of these, combinations of these, and the like. Spacers 46 may be inserted and removed from sidewalls of the etchant chamber housing 44 to control the height of the etching chamber 24.

The etching chamber 24 includes a showerhead 48. In an embodiment the showerhead 48 receives the various etchants from the manifold 28 and helps to disperse the various etchants into the etching chamber 24. The showerhead 48 may be designed to evenly disperse the etchants in order to minimize undesired process conditions that may arise from uneven dispersal. In an embodiment the showerhead 48 may have a circular design with openings dispersed evenly around the showerhead 48 to allow for the dispersal of the desired etchants into the etching chamber 24. However, any suitable method of introducing the desired etchants, such as entry ports, may be utilized to introduce the desired etchants into the etching chamber 24.

Within the etching chamber 24 is located a mounting platform 50 in order to position and control the semiconductor wafer 10 during the etching process. The mounting platform 50 may hold the semiconductor wafer 10 using electrostatic forces, clamps, vacuum pressure, combinations of these, or the like, and may also include heating and cooling mechanisms in order to control the temperature of the semiconductor wafer 10 during the processes. In some embodiments, the controller 30 may control the mounting platform 50 to vary the height $H_1$ of the mounting platform 50 in the etching chamber 24.

In some embodiments, the etching chamber 24 and the mounting platform 50 may be part of a cluster tool system (not shown). The cluster tool system may be used in conjunction with an automated handling system in order to position and place the semiconductor wafer 10 into the etching chamber 24 prior to the etching process, position and hold the semiconductor wafer 10 during the etching processes, and remove the semiconductor wafer 10 from the etching chamber 24 after the etching processes.

The etching chamber 24 also includes a lower electrode 52 coupled to a lower RF generator 54. The lower electrode 52 may be electrically biased by the lower RF generator 54 (under control of the controller 30) at a RF voltage during the etching process. By being electrically biased, the lower electrode 52 is used to provide a bias to the incoming etchants and assist to ignite them into a plasma. The lower electrode 52 is also utilized to maintain the plasma during the etching process by maintaining the bias and also to help accelerate ions from the plasma towards the semiconductor wafer 10.

The etching chamber 24 also includes an upper electrode 56 coupled to an upper RF generator 58, for use as a plasma generator. In an embodiment the plasma generator may be a transformer coupled plasma generator and may be, e.g., a coil. The upper RF generator 58 provides power to the upper electrode 56 (under control of the controller 30) in order to ignite the plasma during introduction of the reactive etchants.

Although the upper electrode 56 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

The etching chamber 24 may include pumping plates 60 that are connected to a vacuum pump 62. In an embodiment the vacuum pump 62 is under the control of the controller 30, and may be utilized to control the pressure within the etching chamber 24 to a desired pressure. Additionally, once the etching process is completed, the pumping plates 60 and the vacuum pump 62 may be utilized to evacuate the etching chamber 24 in preparation for removal of the semiconductor wafer 10.

In an embodiment, the etchant suppliers 32 may supply $NF_3$ and $H_2$ to the etching chamber 24 as etchants. The supplied etchants react according to:

$$NF_3+H_2 \rightarrow NF^++NF_2^+F^++H^++HF+N^+$$

Some of the products of the etchant reaction may themselves recombine and react with the supplied etchants according to:

$$F^++H_2 \rightarrow HF+H^+$$

The products of these reactions then react with a material of the semiconductor wafer 10, which is Si in an embodiment, according to:

$$Si+H^+ \rightarrow SiH^+$$

The $SiH^+$ is a solid that remains on the surface of the semiconductor wafer 10. It reacts with the products of the previous etchant reaction according to:

$$SiH^++HF \rightarrow SiF+H_2$$

Again, the SiF is a solid that remains on the surface of the semiconductor wafer 10. Finally, the SiF reacts with the products of the previous etchant reaction according to:

$$SiF+H^++HF \rightarrow SiF_2+H_2$$

The resulting $SiF_2$ is not a solid. Rather, the resulting $SiF_2$ and $H_2$ are gases that can be removed from the surface of the semiconductor wafer 10. These gasses may be evacuated from the etching chamber 24 with the pumping plates 60 and the vacuum pump 62.

Although a number of particular parts of the etching system 20 have been described above, other suitable parts may also be included. For example, endpoint mounts, liners, and any other parts that may help operate or control the etching process may also be included. All such parts are fully intended to be included within the scope of the embodiments.

Figure 3A:
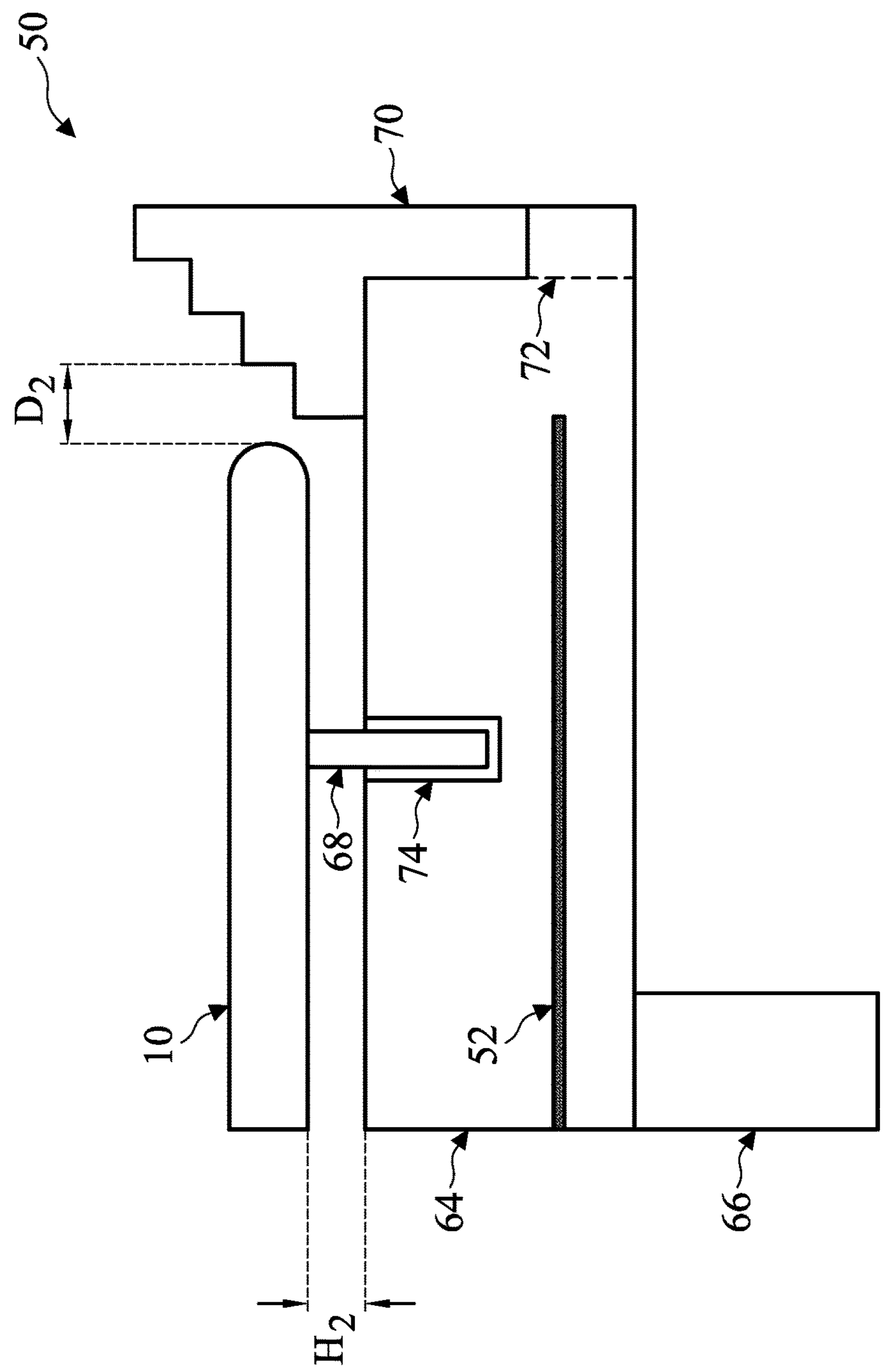
Figure 3B:
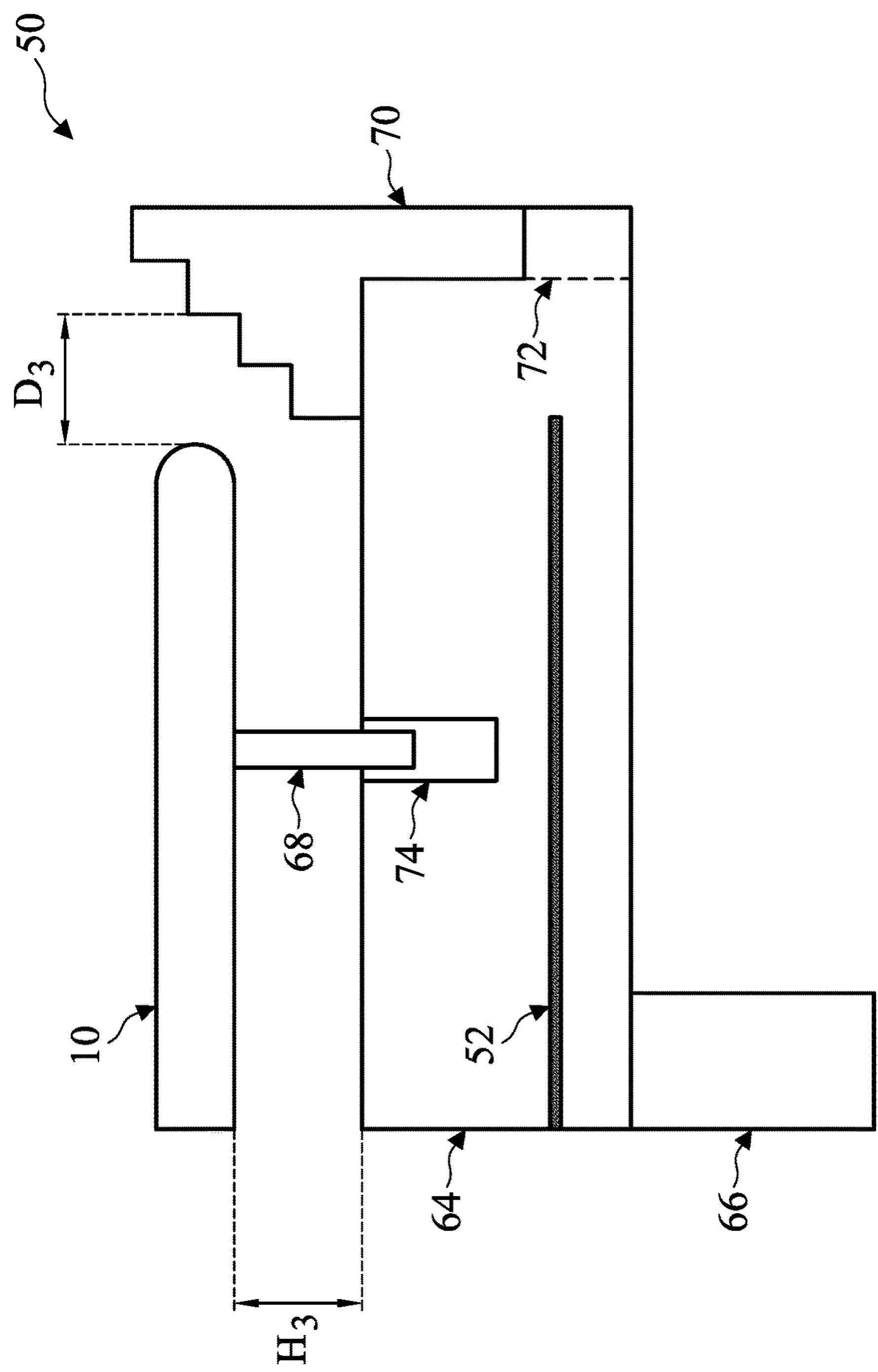

FIGS. 3A-3B are close-up views of a portion of the mounting platform 50, with a portion of the joint between the semiconductor wafer 10 and the mounting platform 50 being illustrated. As can be seen, the mounting platform 50 in this view may comprise a number of different components to help hold and secure the semiconductor wafer 10 before, during, and after the etching process. The mounting platform 50 is controllable such that the etch rate of the edge region 14 of the semiconductor wafer 10 may be controlled. In a particular embodiment the mounting platform 50 includes a chuck 64, a support 66, push pins 68, and an edge ring 70.

In an embodiment the chuck 64 is an electrostatic chuck that uses the lower electrode 52 to not only generate and maintain the plasma during the etching process, but also uses electrostatic forces generated by the lower electrode 52 to hold and support the semiconductor wafer 10 attached to the mounting platform 50. As such, the lower electrode 52 is incorporated into the chuck 64. However, any suitable combination of chucks, such as clamping chucks or vacuum chucks, and lower electrode 52 may be utilized. In an embodiment the chuck 64 has a chuck edge portion 72 (represented in FIGS. 3A-3B by the dashed line), that helps to allow for placement of the edge ring 70. In an embodiment the chuck edge portion 72 extends inwards in order to allow for alignment with the edge ring 70. The chuck 64 is supported by the support 66, which is controlled by the controller 30 to move the mounting platform 50 up and down so as to vary the height $H_1$. The push pins 68 are in the chuck 64 and may be pushed in and out of slots 74 to vary the height of the semiconductor wafer 10 over the chuck 64.

The edge ring 70 is over the chuck 64, and may be over the chuck edge portion 72 in embodiments where the chuck 64 has the chuck edge portion 72. The edge ring 70 helps to provide fine positioning for the semiconductor wafer 10 over the chuck 64 while also containing the semiconductor wafer 10 from moving off of the chuck 64 prior to an attachment of the semiconductor wafer 10 to the chuck 64 (e.g., before application of the electrostatic forces when the chuck 64 is an electrostatic chuck). In addition, the edge ring 70 also works to help shield the chuck 64 from damage during the etching process. As such, in some embodiments, the edge ring 70 is placed such that no portion of the top surface of the chuck 64 or the chuck edge portion 72 is directly exposed to plasma during the etching process.

The edge ring 70 is graded so that it has different widths at different points. The edge ring 70 has a largest width at a portion proximate the chuck 64, and decreases in width in portions distal the chuck 64. The width of the edge ring 70 may decrease in several manners. In the embodiment shown, the graded portion of the edge ring 70 is stepped, such that it has several discrete widths. In some embodiments, the graded portion of the edge ring 70 is sloped (see FIG. 4B), such that it has a continuously decreasing width. Grading the width of the edge ring 70 allows the distance between the edge ring 70 and the edge region 14 of the semiconductor wafer 10 to be controlled by varying the height of the edge ring 70 on the chuck 64. Increasing the distance from the semiconductor wafer 10 to the edge ring 70 may increase the etch rate of the edge region 14. As shown in FIGS. 3A-3B, when the semiconductor wafer 10 is a height $H_2$ from the chuck 64, it is a distance $D_2$ from the edge ring 70. Likewise, when the semiconductor wafer 10 is increased to being a height $H_3$ from the chuck 64, the distance $D_3$ from the edge ring 70 also increases. The edge ring 70 may be graded with a constant grade such that the distance from the semiconductor wafer 10 to the edge ring 70 is directly proportional to the height of the semiconductor wafer 10. Because the push pins 68 are pushed in and out to vary the distance from the semiconductor wafer 10 to the edge ring 70, the push pins 68 may therefore have a height less than a height of the edge ring 70.

The edge ring 70 is coated with a material that does not act as a solid phase catalyst with the products of the etchant reaction (discussed above). Selecting a material that is not a solid phase catalyst in the etchant reaction reduces the recombination rate of H+ radicals from the etchant reaction. For example, the edge ring 70 may be a dielectric, semiconductor, or metal that is coated with one or more metals, such as Ni, Pt, or Au. In some embodiments, the metal coating is a pure metal. In some embodiments, the metal coating is an alloy of several metals. It should be appreciated that other coatings could be used in other recipes, depending on, e.g., the etchants selected and the material being etched from the semiconductor wafer 10. Reducing or controlling the recombination rate may allow the etch rate of the edge region 14 of the semiconductor wafer 10 (e.g., regions proximate the edge ring 70) to be varied with respect to the etch rate of the central region 12 (e.g., regions distal the edge ring 70).

Figure 4B:
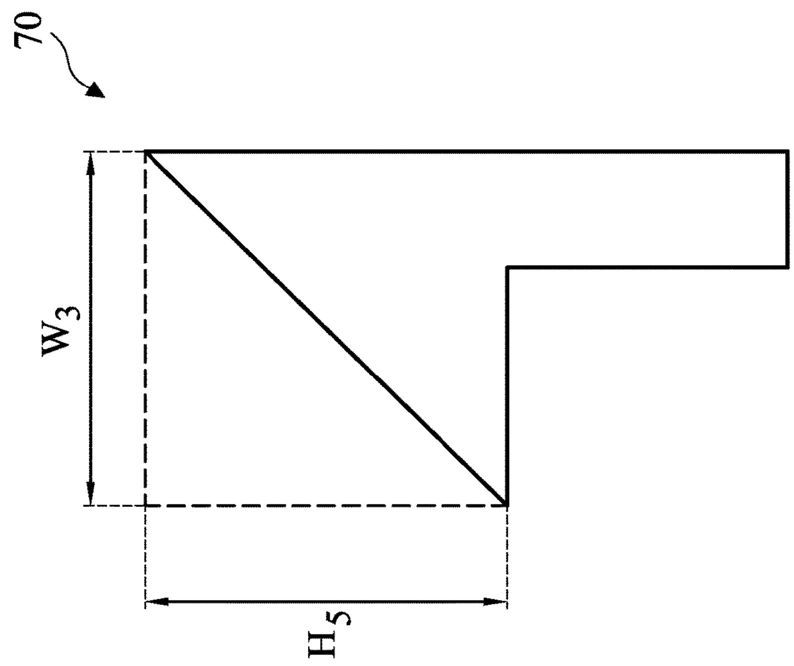
Figure 4A:
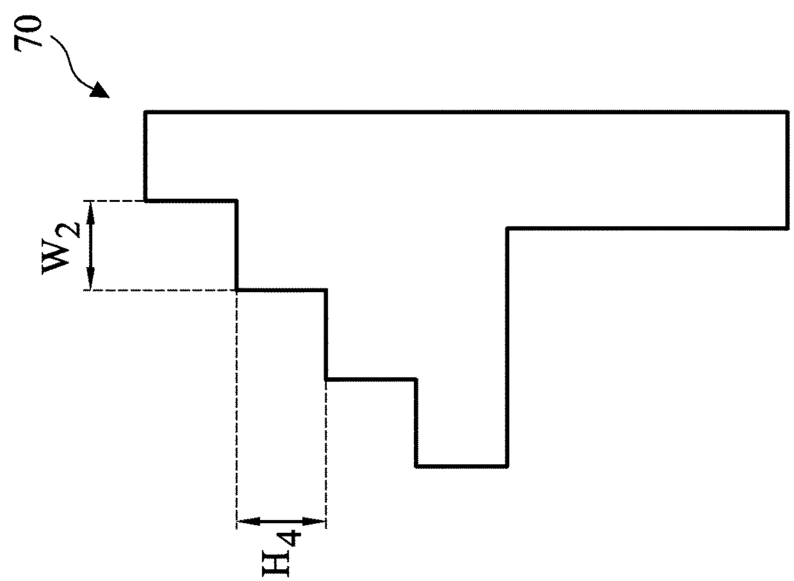

FIG. 4A is a close-up cross-sectional view of the edge ring 70 according to an embodiment. As noted above, the edge ring 70 has a largest width at the base, and decreases in width towards the top. In the embodiment shown in FIG. 4A, the edge ring 70 is graded with a plurality of steps, such as from about 2 steps to about 10 steps, such as about 4 steps.

Each step has a width $W_2$ from about 1 mm to about 5 mm, such as about 2.5. Each step has a height $H_4$ from about 1 mm to about 5 mm, such as about 1.

FIG. 4B is a close-up cross-sectional view of the edge ring 70 according to another embodiment. As noted above, the edge ring 70 has a largest width at the base, and decreases in width towards the top. In the embodiment shown in FIG. 4B, the edge ring 70 is graded with a continuously decreasing width. FIG. 4B also illustrates the overall height $H_5$ and the overall width $W_3$ of the edge ring 70, which may be the same as the overall height and the overall width of the embodiment shown in FIG. 4A. In an embodiment, the overall height $H_5$ of the edge ring 70 is about 5 mm, and the overall width $W_3$ of the edge ring 70 is about 15 mm.

Controlling the etch rate of the edge region of a wafer may allow a more uniform etching profile to be achieved across the wafer. The etching system 20 with the edge ring 70 may be used, for example, in a process of forming a FinFET. Specifically, the system may be used for removal of a dummy gate on a FinFET. However, it should be appreciated that the etching system can be used in any step or process flow that uses an etching step.

Figure 5:
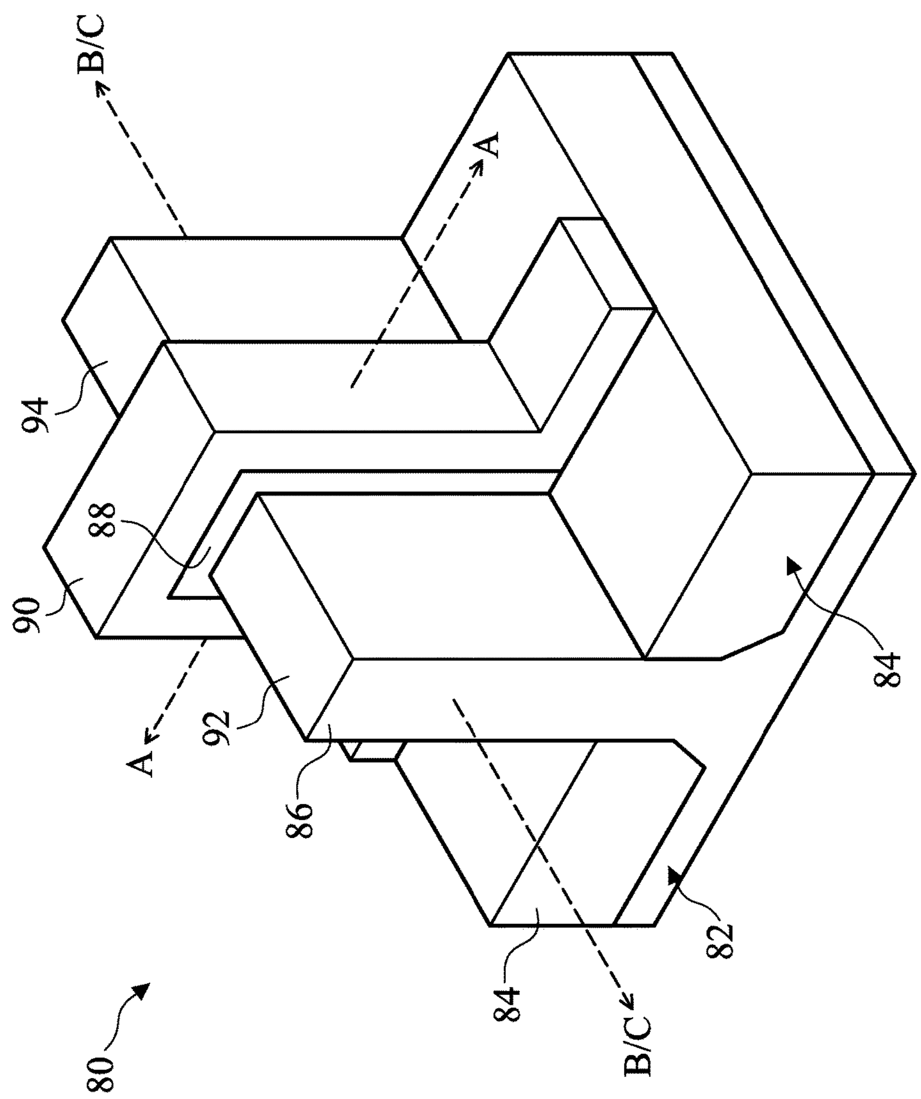
FIG. 5 is an example of a Fin Field-Effect Transistor (FinFET) in a three-dimensional view, in accordance with some embodiments.

FIG. 5 illustrates an example of a FinFET 80 in a three-dimensional view. The FinFET 80 comprises a fin 86 on a substrate 82. The substrate 82 includes isolation regions 84, and the fin 86 protrudes above and from between neighboring isolation regions 84. A gate dielectric 88 is along sidewalls and over a top surface of the fin 86, and a gate electrode 90 is over the gate dielectric 88. Source/drain regions 92 and 94 are disposed in opposite sides of the fin 86 with respect to the gate dielectric 88 and gate electrode 90. FIG. 5 further illustrates reference cross-sections that are used in later figures. Cross-section A-A is across a channel, gate dielectric 88, and gate electrode 90 of the FinFET 80. Cross-section B/C-B/C is perpendicular to cross-section A-A and is along a longitudinal axis of the fin 86 and in a direction of, for example, a current flow between the source/drain regions 92 and 94. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 6 through 18C are cross-sectional views of intermediate stages in the manufacturing of FinFETs on the semiconductor wafer 10, in accordance with exemplary embodiments. FIGS. 6 through 10 illustrate reference cross-section A-A illustrated in FIG. 5, except for multiple FinFETs. In FIGS. 11A through 18C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 6:
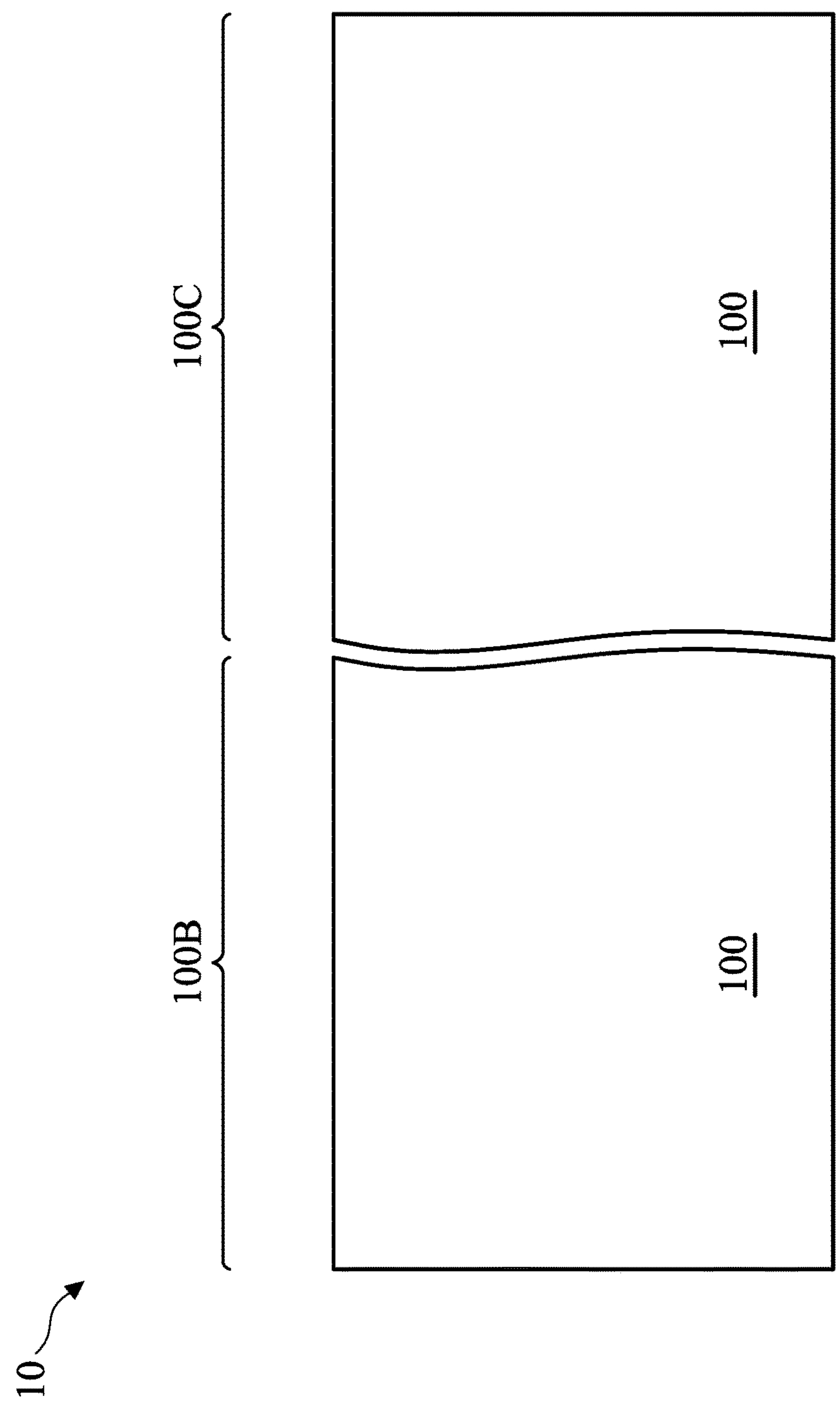
FIGS. 6 through 18C are cross-sectional views of intermediate stages in the manufacturing of FinFETs, in accordance with some embodiments.

In FIG. 6, a substrate 100 is provided to form the semiconductor wafer 10. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 100 has a first region 100B and a second region 100C. The first region 100B (which corresponds to subsequent figures ending in "B") can be for forming n-type devices, such as NMOS transistors, such as n-type FinFETs. The second region 100C (which corresponds to subsequent figures ending in "C") can be for forming p-type devices, such as PMOS transistors, such as p-type FinFETs.

Figure 7:
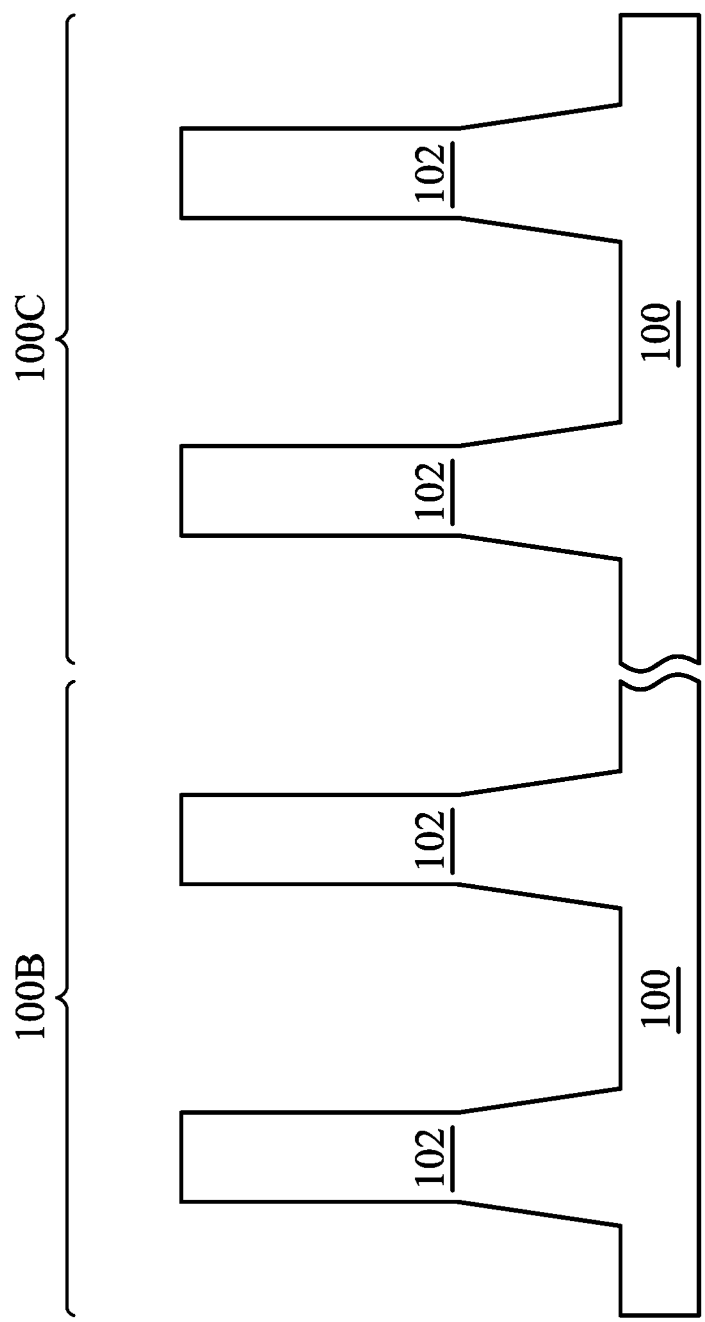
Figure 8:
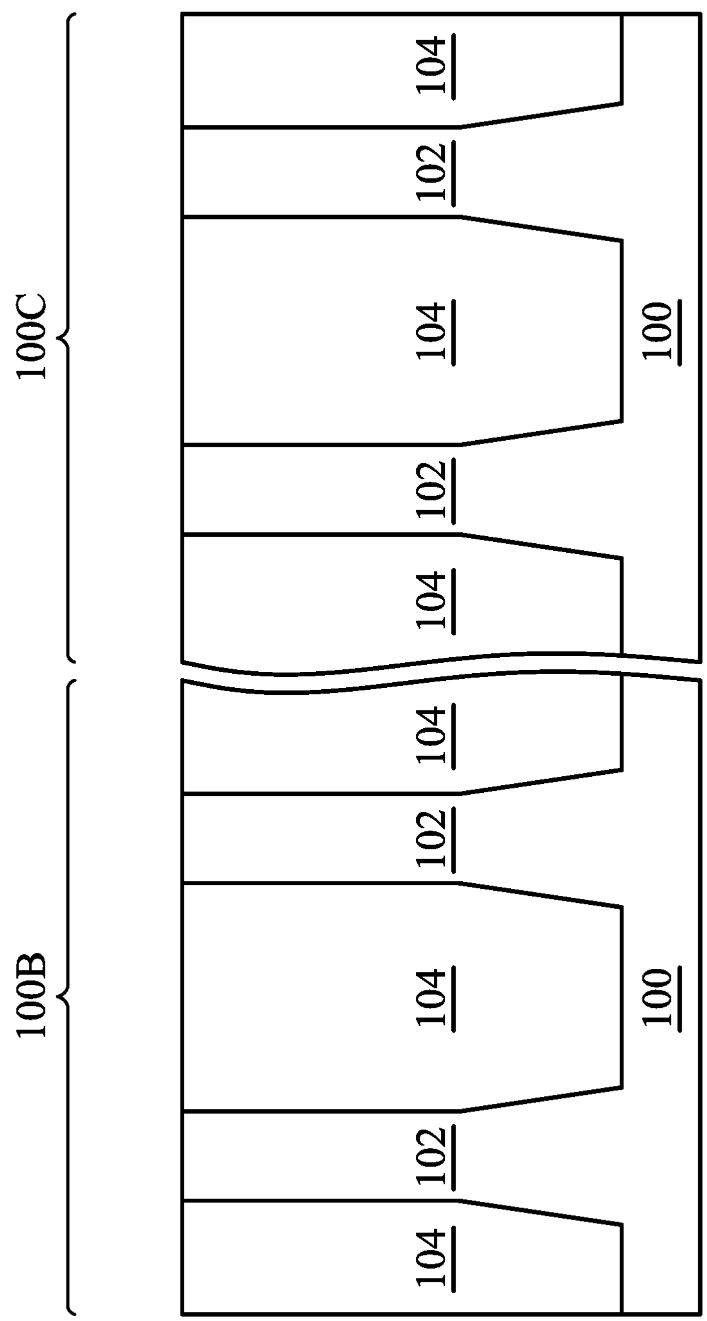

In FIGS. 7 and 8, fins 102 are formed and isolation regions 104 are formed between neighboring fins 102. In FIG. 7, the fins 102 are formed in the substrate 100. In some embodiments, the fins 102 may be semiconductor strips formed in the substrate 100 by etching trenches in the substrate 100. The etching may be any acceptable etch process, such as a reactive ion etch (RIE), neutral beam etch (NBE), the like, or a combination thereof. The etch may be anisotropic.

In FIG. 8, an insulation material 104 is formed between neighboring fins 102 to form the isolation regions 104. The insulation material 104 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 104 is silicon oxide formed by a FCVD process. The insulation material 104 may be referred to as isolation regions 104. Further in FIG. 8, a planarization process, such as a chemical mechanical polish (CMP), may remove any excess of the insulation material 104 and form top surfaces of the isolation regions 104 and top surfaces of the fins 102 that are coplanar.

Figure 9:
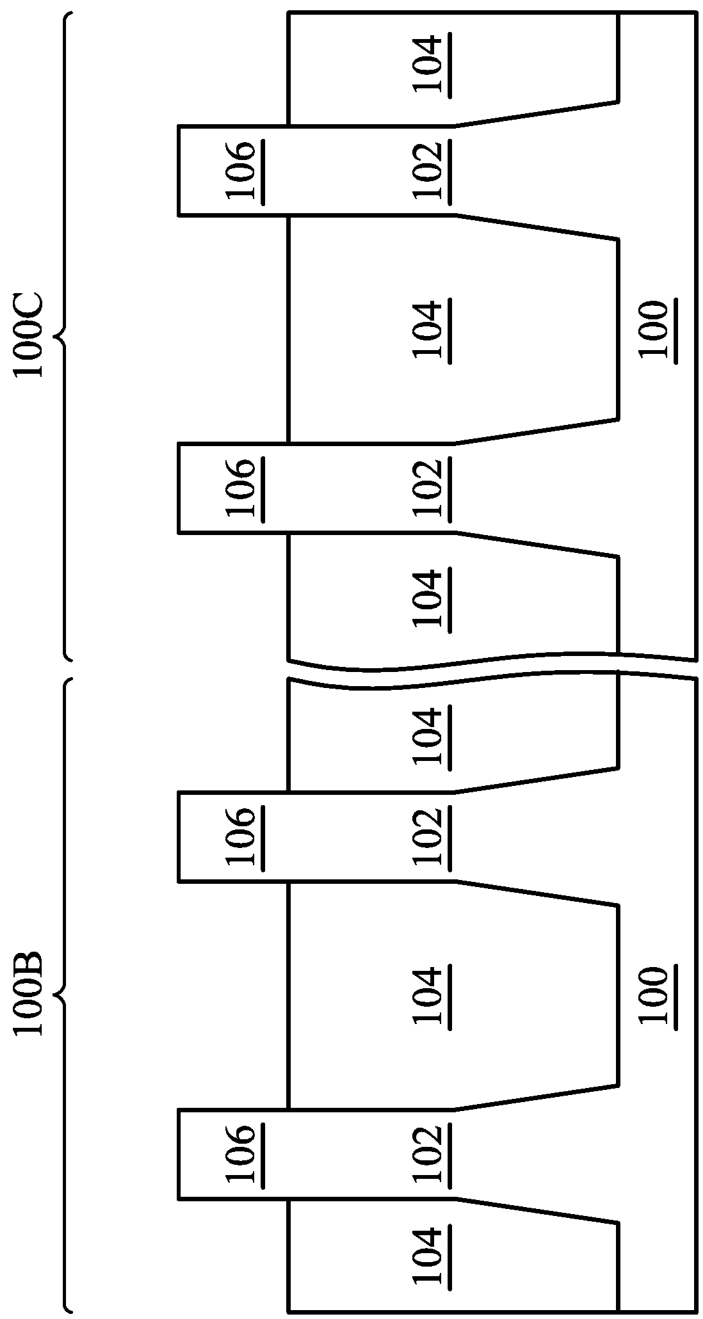

In FIG. 9, the isolation regions 104 are recessed to form STI regions. The isolation regions 104 are recessed such that fins 106 in the first region 100B and in the second region 100C protrude from between neighboring isolation regions 104. Further, the top surfaces of the isolation regions 104 may have a flat surface as illustrated, a convex surface, a concave surface (such as dishing), or a combination thereof. The top surfaces of the isolation regions 104 may be formed flat, convex, and/or concave by an appropriate etch. The isolation regions 104 may be recessed using an acceptable etching process, such as one that is selective to the material of the isolation regions 104. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 7 through 9 is just one example of how the fins 106 may be formed. In other embodiments, a dielectric layer can be formed over a top surface of the substrate 100; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 102 in FIG. 7 can be recessed, and a material different from the fins 102 may be epitaxially grown in their place. In an even further embodiment, a dielectric layer can be formed over a top surface of the substrate 100; trenches can be etched through the dielectric layer; heteroepitaxial structures can be epitaxially grown in the trenches using a material different from the substrate 100; and the dielectric layer can be recessed such that the heteroepitaxial structures protrude from the dielectric layer to form fins 106. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 106 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 9, appropriate wells may be formed in the fins 106, fins 102, and/or substrate 100. For example, a P well may be formed in the first region 100B, and an N well may be formed in the second region 100C.

The different implant steps for the first region 100B and the second region 100C may be achieved using a photoresist or other masks (not shown). For example, a photoresist is formed over the fins 106 and the isolation regions 104 in the first region 100B. The photoresist is patterned to expose the second region 100C of the substrate 100, such as a PMOS region. The photoresist can be formed by using a spin-on technique and can be patterned using acceptable photolithography techniques. Once the photoresist is patterned, an n-type impurity implant is performed in the second region 100C, and the photoresist may act as a mask to substantially prevent n-type impurities from being implanted into the first region 100B, such as an NMOS region. The n-type impurities may be phosphorus, arsenic, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist is removed, such as by an acceptable ashing process.

Following the implanting of the second region 100C, a photoresist is formed over the fins 106 and the isolation regions 104 in the second region 100C. The photoresist is patterned to expose the first region 100B of the substrate 100, such as the NMOS region. The photoresist can be formed by using a spin-on technique and can be patterned using acceptable photolithography techniques. Once the photoresist is patterned, a p-type impurity implant may be performed in the first region 100B, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist may be removed, such as by an acceptable ashing process.

After the implants of the first region 100B and the second region 100C, an anneal may be performed to activate the p-type and n-type impurities that were implanted. The implantations may form a p-well in the first region 100B, e.g., the NMOS region, and an n-well in the second region 100C, e.g., the PMOS region. In some embodiments, the grown materials of epitaxial fins may be in situ doped during growth, which may obviate the implantations, although in situ and implantation doping may be used together.

Figure 10:
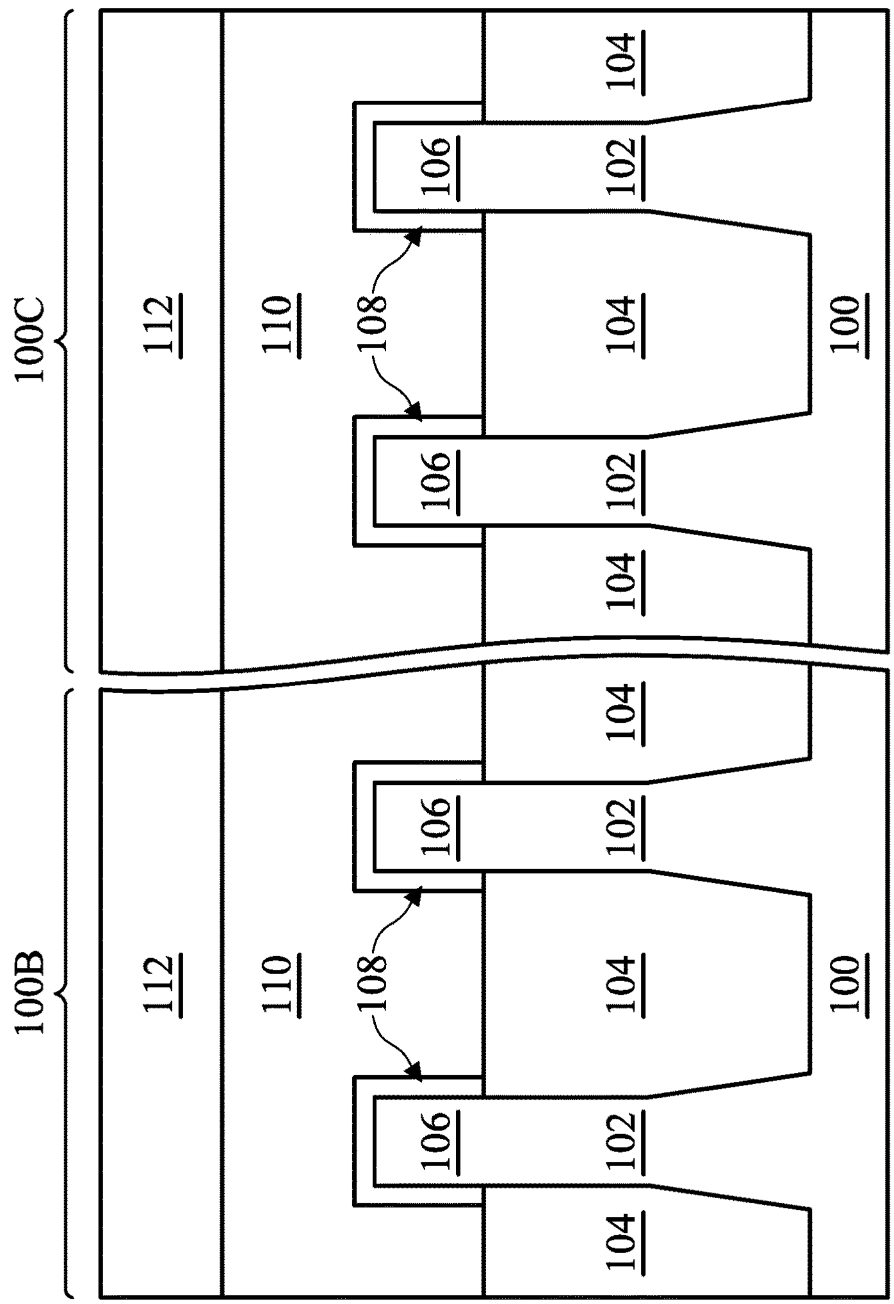

In FIG. 10, a dummy dielectric layer 108 is formed on the fins 106. The dummy dielectric layer 108 may be, for example, silicon oxide, silicon nitride, a combination thereof, or the like, and may be deposited or thermally grown according to acceptable techniques. A dummy gate layer 110 is formed over the dummy dielectric layer 108, and a mask layer 112 is formed over the dummy gate layer 110. The dummy gate layer 110 may be deposited over the dummy dielectric layer 108 and then planarized, such as by a CMP. The mask layer 112 may be deposited over the dummy gate layer 110. The dummy gate layer 110 may be made of, for example, polysilicon, although other materials that have a high etching selectivity from the etching of isolation regions 104 may also be used. The mask layer 112 may include, for example, silicon nitride or the like. In this example, the dummy gate layer 110 and the mask layer 112 are formed across the first region 100B and the second region 100C as single layers. In other embodiments, separate dummy gate layers may be formed in the first region 100B and the second region 100C, and separate mask layers may be formed in the first region 100B and the second region 100C.

Figure 11A:
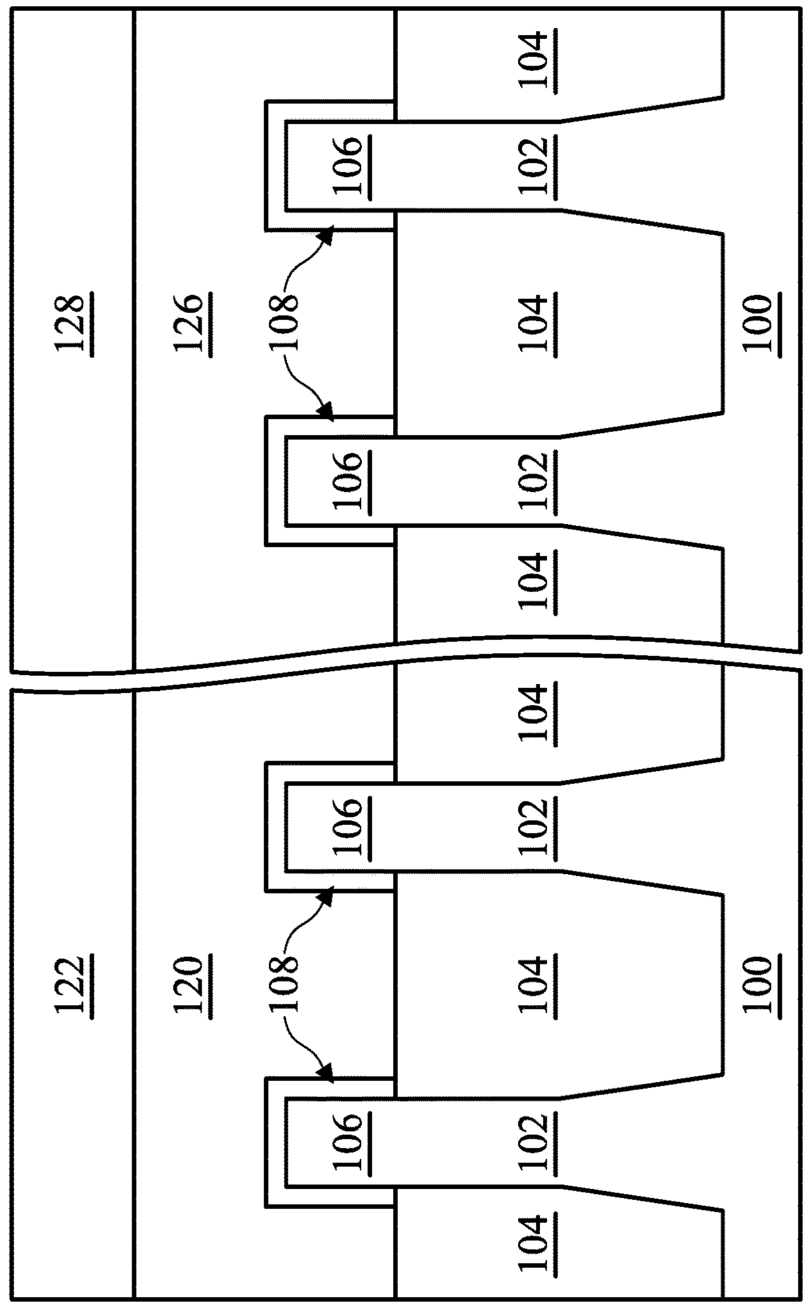
Figure 11C:
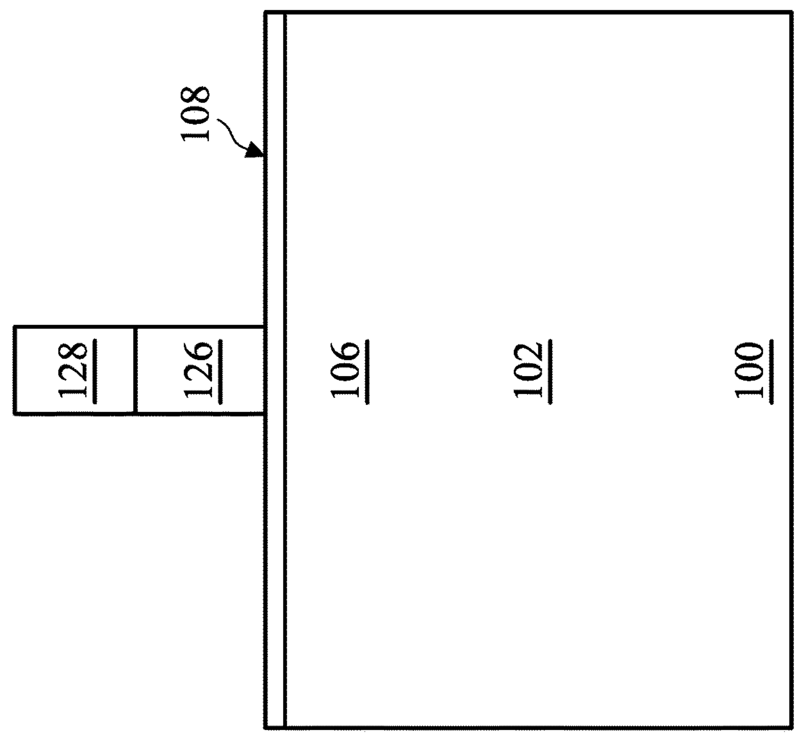
Figure 11B:
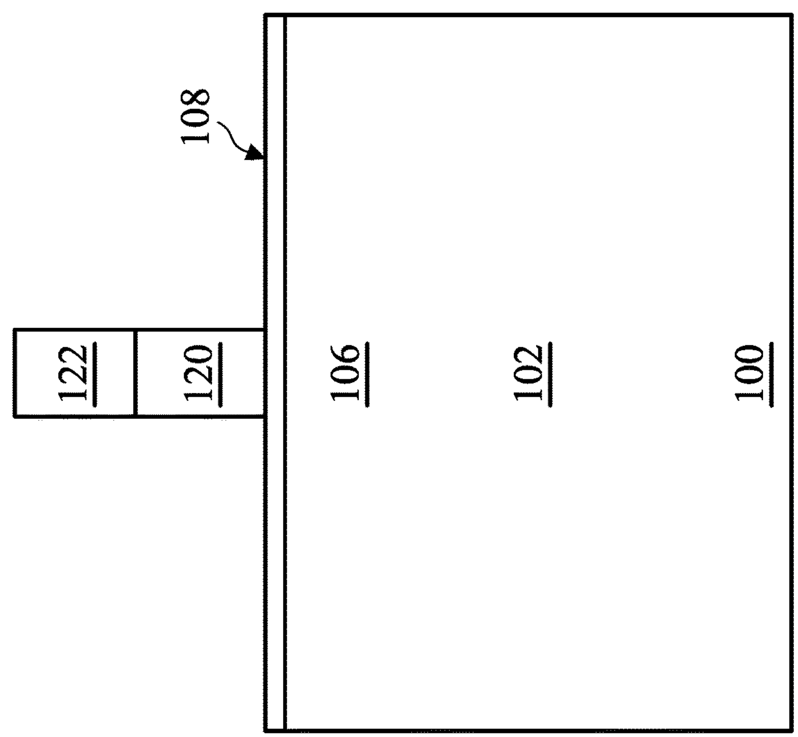

In FIGS. 11A, 11B, and 11C, the mask layer 112 may be patterned using acceptable photolithography and etching techniques to form masks 122 in the first region 100B (as illustrated in FIG. 11B) and masks 128 in the second region 100C (as illustrated in FIG. 11C). The pattern of the masks 122 and 128 then may be transferred to the dummy gate layer 110 and dummy dielectric layer 108 by an acceptable etching technique to form dummy gates 120 in the first region 100B and dummy gates 126 in the second region 100C. The dummy gates 120 and 126 cover respective channel regions of the fins 106. The dummy gates 120 and 126 may also have a lengthwise direction substantially perpendicular to the lengthwise direction of respective epitaxial fins.

Figure 12A:
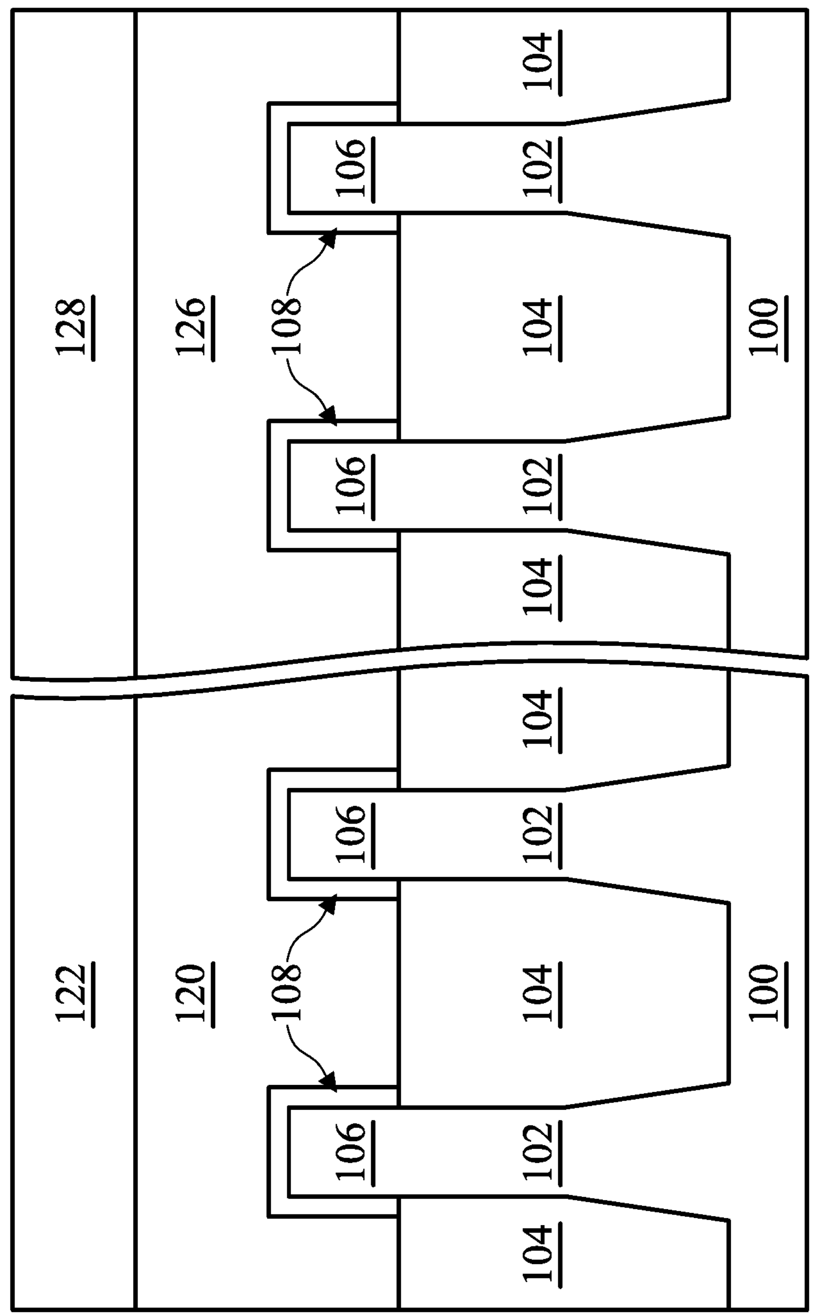
Figure 12C:
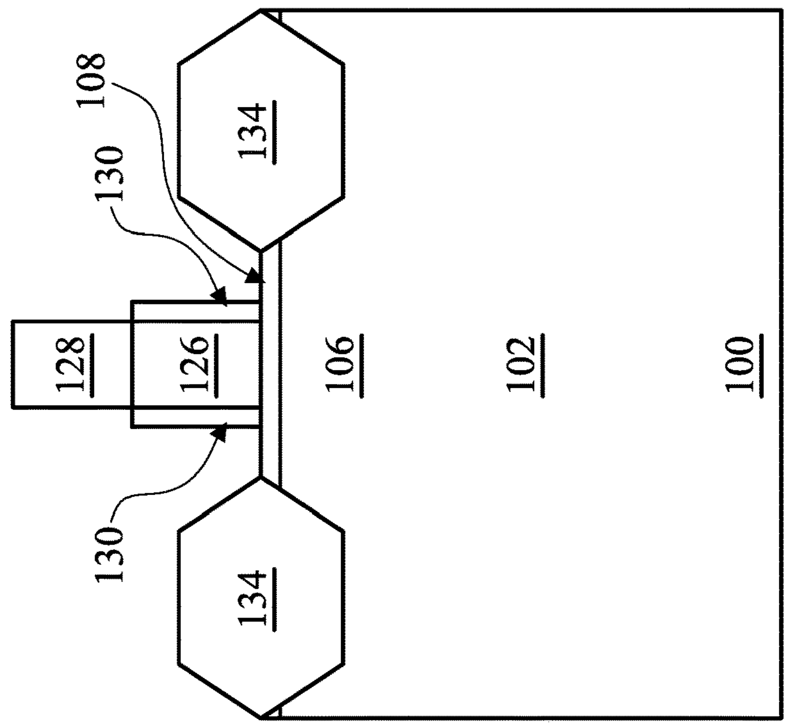
Figure 12B:
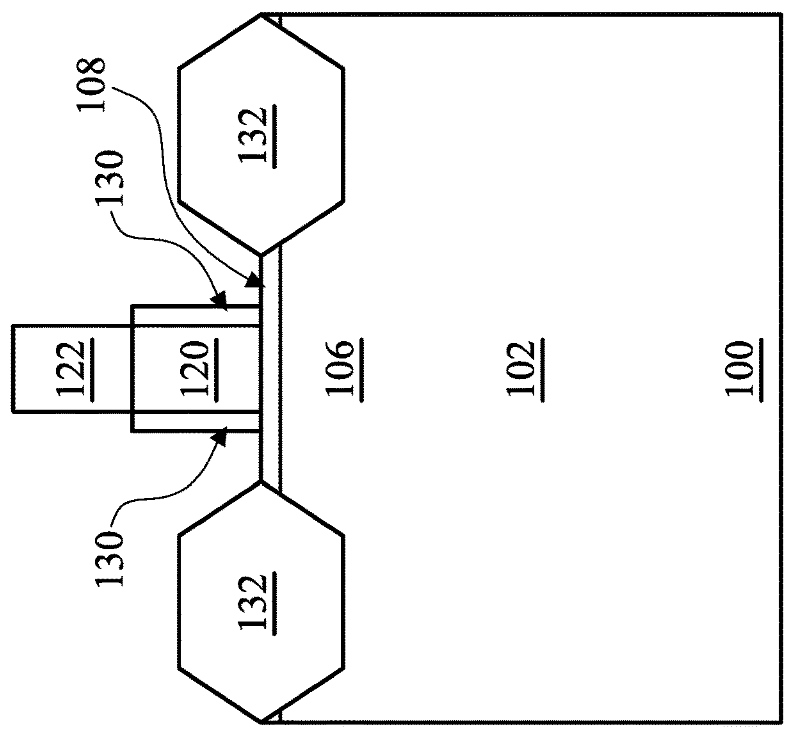

In FIGS. 12A, 12B, and 12C, gate seal spacers 130 can be formed on exposed surfaces of respective ones of the dummy gates 120 and 126 and/or fins 106. A thermal oxidation or a deposition followed by an anisotropic etch may form the gate seal spacers 130.

After the formation of the gate seal spacers 130, implants for lightly doped source/drain (LDD) regions may be performed. Similar to the implants discussed above in FIG. 9, a mask, such as a photoresist, may be formed over the first region 100B, e.g., NMOS region, while exposing the second region 100C, e.g., PMOS region, and p-type impurities may be implanted into the exposed fins 106 in the second region 100C. The mask may then be removed. Subsequently, a mask, such as a photoresist, may be formed over the second region 100C while exposing the first region 100B, and n-type impurities may be implanted into the exposed fins 106 in the first region 100B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Further in FIGS. 12A, 12B, and 12C, epitaxial source/drain regions 132 and 134 are formed in the fins 106. In the first region 100B, epitaxial source/drain regions 132 are formed in the fins 106 such that each of the dummy gates 120 are disposed between respective neighboring pairs of the epitaxial source/drain regions 132. In some embodiments the epitaxial source/drain regions 132 may extend into the fins 102. In the second region 100C, epitaxial source/drain regions 134 are formed in the fins 106 such that each of the dummy gates 126 is disposed between respective neighboring pairs of the epitaxial source/drain regions 134. In some embodiments the epitaxial source/drain regions 134 may extend into the fins 102.

Epitaxial source/drain regions 132 in the first region 100B, e.g., the NMOS region, may be formed by masking the second region 100C, e.g., the PMOS region, and conformally depositing a dummy spacer layer in the first region 100B followed by an anisotropic etch to form dummy gate spacers (not shown) along sidewalls of the dummy gates 120 and/or gate seal spacers 130 in the first region 100B. Then, source/drain regions of the epitaxial fins in the first region 100B are etched to form recesses. The epitaxial source/drain regions 132 in the first region 100B are epitaxially grown in the recesses. The epitaxial source/drain regions 132 may include any acceptable material, such as appropriate for n-type FinFETs. For example, if the fins 106 are silicon, the epitaxial source/drain regions 132 may include silicon, SiC, SiCP, SiP, or the like. The epitaxial source/drain regions 132 may have surfaces raised from respective surfaces of the fins 106 and may have facets. Subsequently, the dummy gate spacers in the first region 100B are removed, for example, by an etch, as is the mask on the second region 100C.

Epitaxial source/drain regions 134 in the second region 100C, e.g., the PMOS region, may be formed by masking the first region 100B, e.g., the NMOS region, and conformally depositing a dummy spacer layer in the second region 100C followed by an anisotropic etch to form dummy gate spacers (not shown) along sidewalls of the dummy gates 126 and/or gate seal spacers 130 in the second region 100C. Then, source/drain regions of the epitaxial fins in the second region 100C are etched to form recesses. The epitaxial source/drain regions 134 in the second region 100C are epitaxially grown in the recesses. The epitaxial source/drain regions 134 may include any acceptable material, such as appropriate for p-type FinFETs. For example, if the fins 106 are silicon, the epitaxial source/drain regions 134 may comprise SiGe, SiGeB, Ge, GeSn, or the like. The epitaxial source/drain regions 134 may have surfaces raised from respective surfaces of the fins 106 and may have facets. Subsequently, the dummy gate spacers in the second region 100C are removed, for example, by an etch, as is the mask on the first region 100B.

Figure 13A:
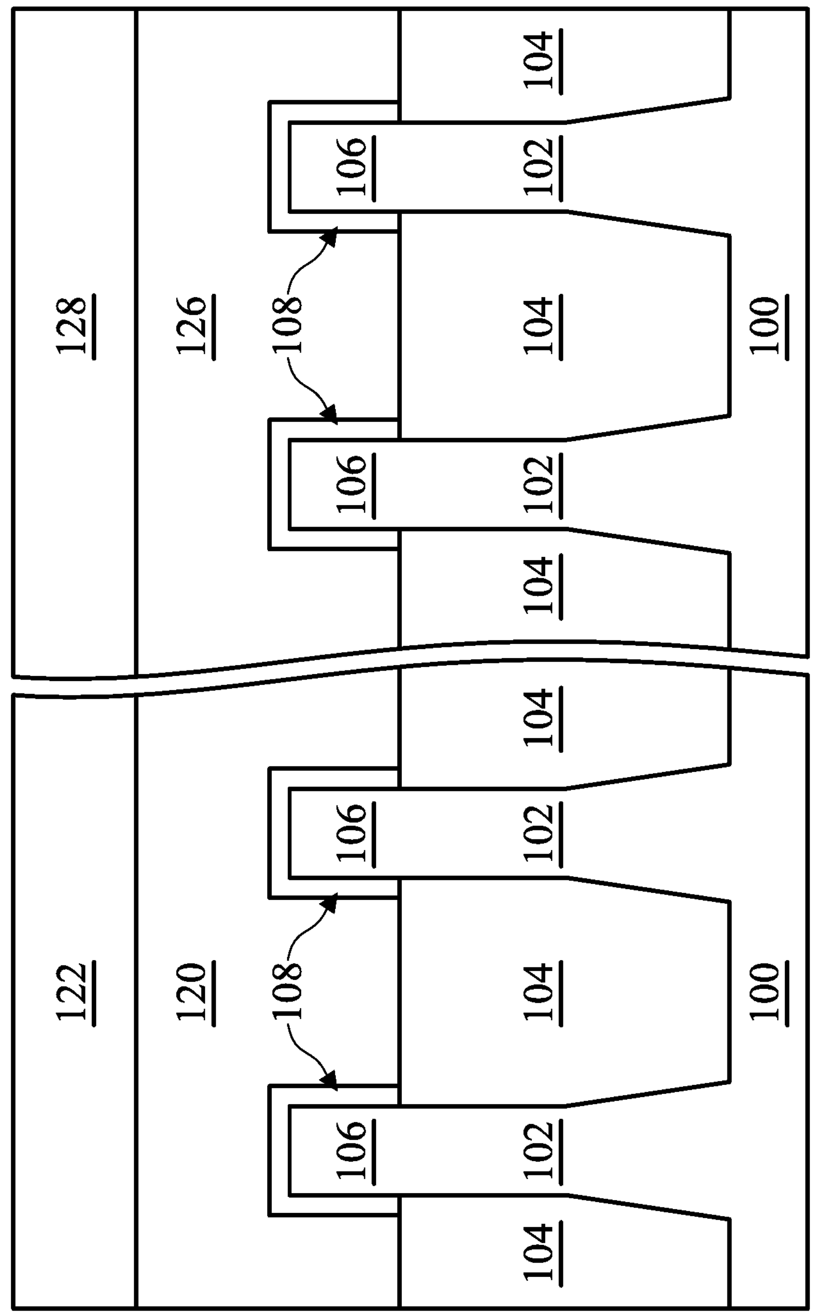
Figure 13C:
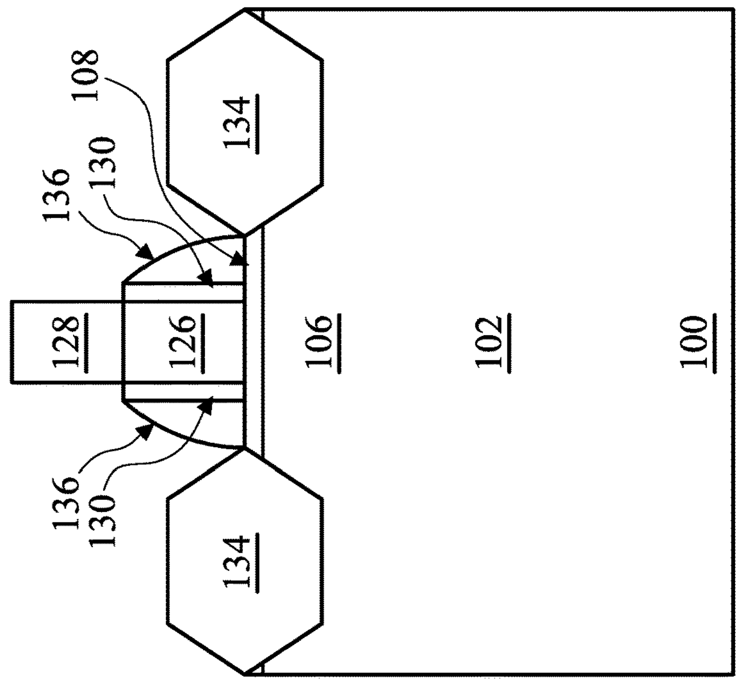
Figure 13B:
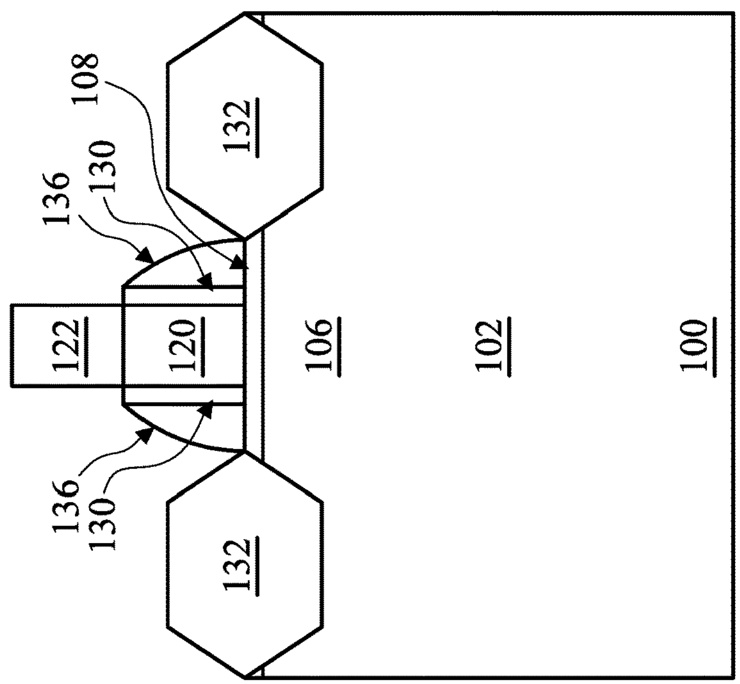

In FIGS. 13A, 13B, and 13C, gate spacers 136 are formed on the gate seal spacers 130 along sidewalls of the dummy gates 120 and 126. The gate spacers 136 may be formed by conformally depositing a material and subsequently anisotropically etching the material. The material of the gate spacers 136 may be silicon nitride, SiCN, a combination thereof, or the like.

The epitaxial source/drain regions 132 and 134 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ $cm^{-3}$ to about $10^{21}$ $cm^{-3}$. The n-type impurities for source/drain regions in the first region 100B, e.g., the NMOS region, may be any of the n-type impurities previously discussed, and the p-type impurities for source/drain regions in the second region 100C, e.g., the PMOS region, may be any of the p-type impurities previously discussed. In other embodiments, the epitaxial source/drain regions 132 and 134 may be in situ doped during growth.

Figure 14A:
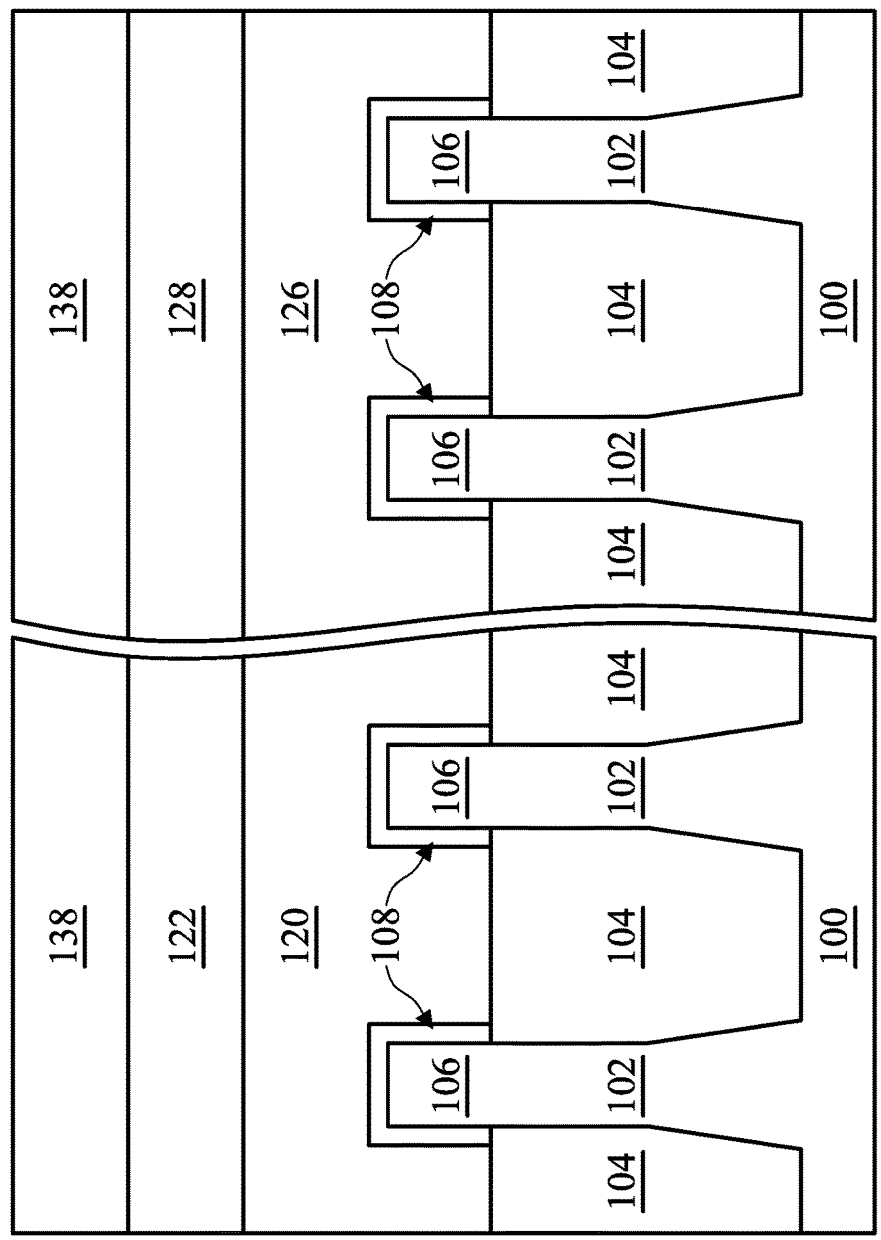
Figure 14C:
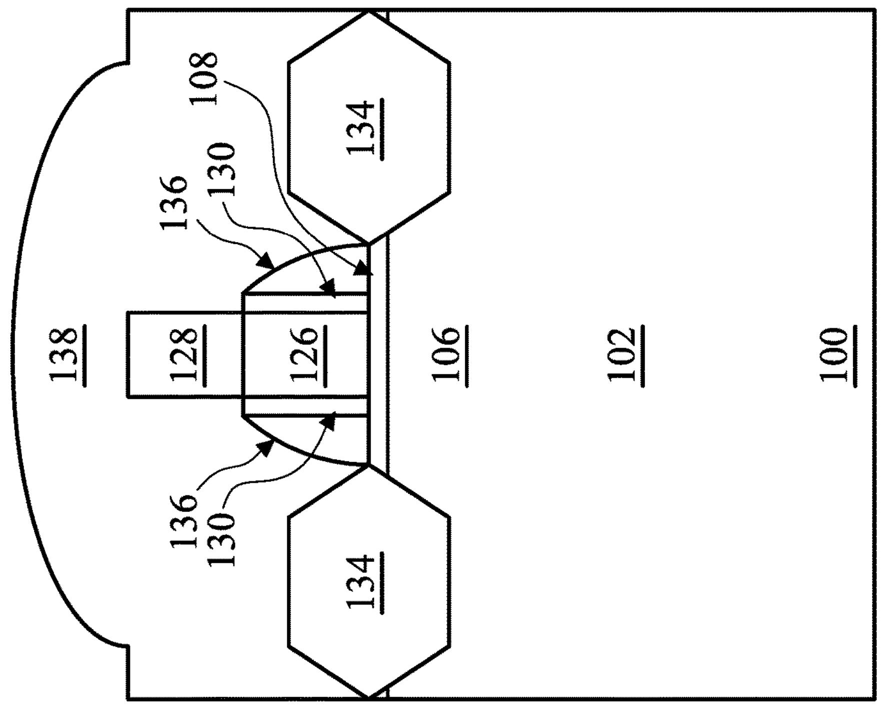
Figure 14B:
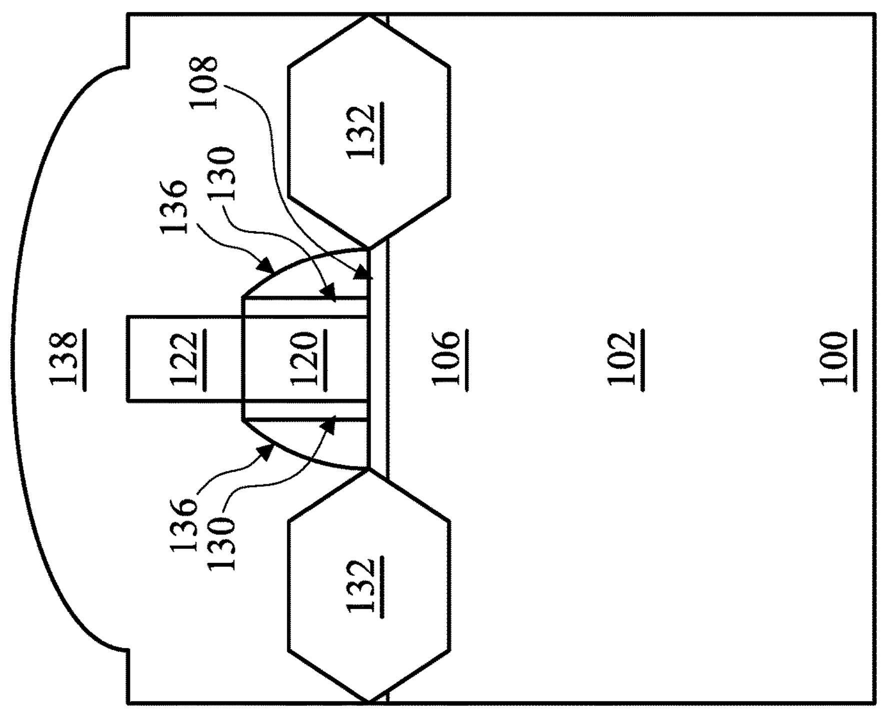

In FIGS. 14A, 14B, and 14C, an inter-layer dielectric (ILD) 138 is deposited over the structure illustrated in FIGS. 13A, 13B, and 13C. In an embodiment, the ILD 138 is a flowable film formed by a flowable CVD. In some embodiments, the ILD 138 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 15A:
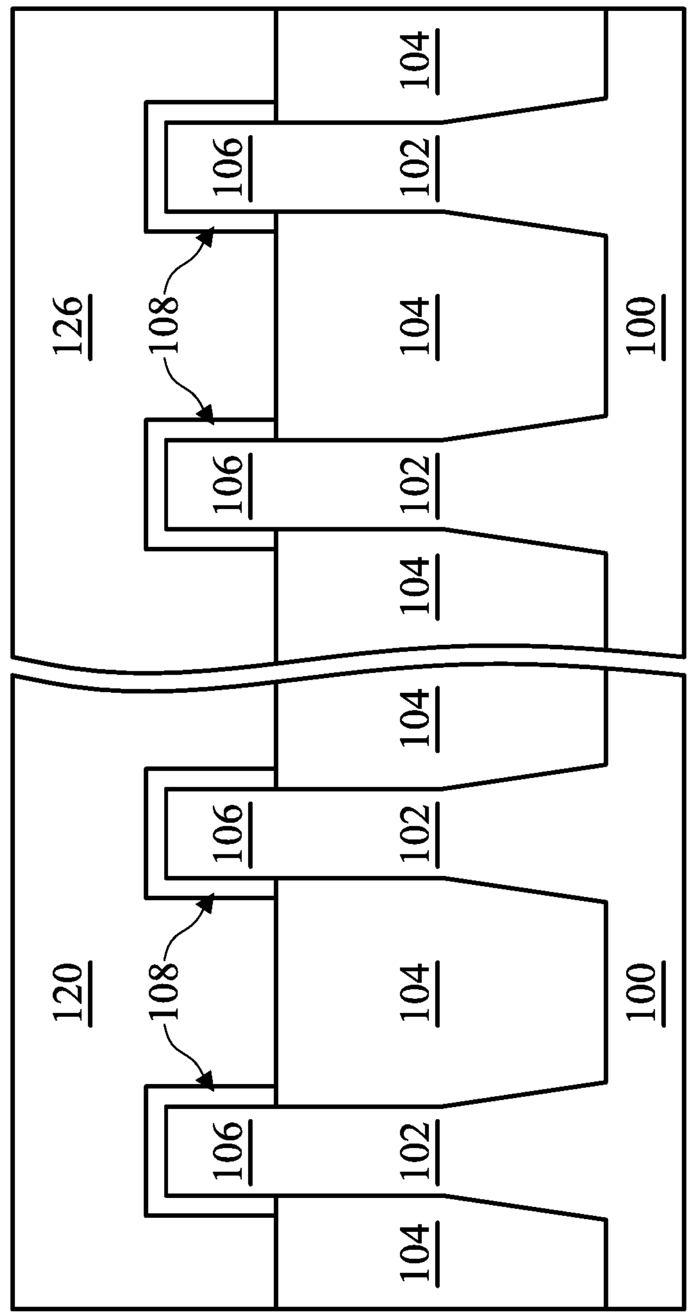
Figure 15C:
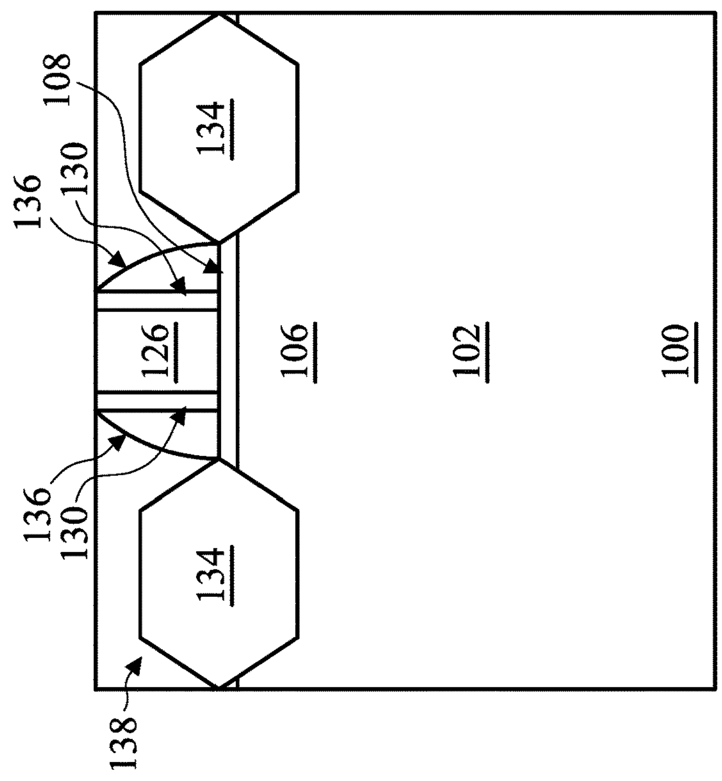
Figure 15B:
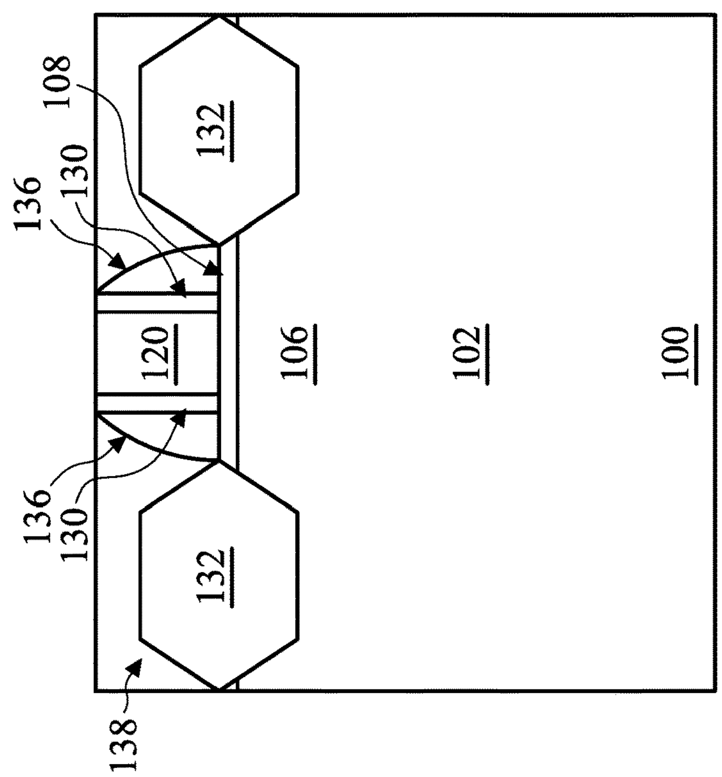

In FIGS. 15A, 15B, and 15C, a planarization process, such as a CMP, may be performed to level the top surface of ILD 138 with the top surfaces of the dummy gates 120 and 126. The CMP may also remove the masks 122 and 128 on the dummy gates 120 and 126. Accordingly, top surfaces of the dummy gates 120 and 126 are exposed through the ILD 138. In some embodiments, the ILD 138 may have a thickness of about 200 Å after the planarization process.

Figure 16A:
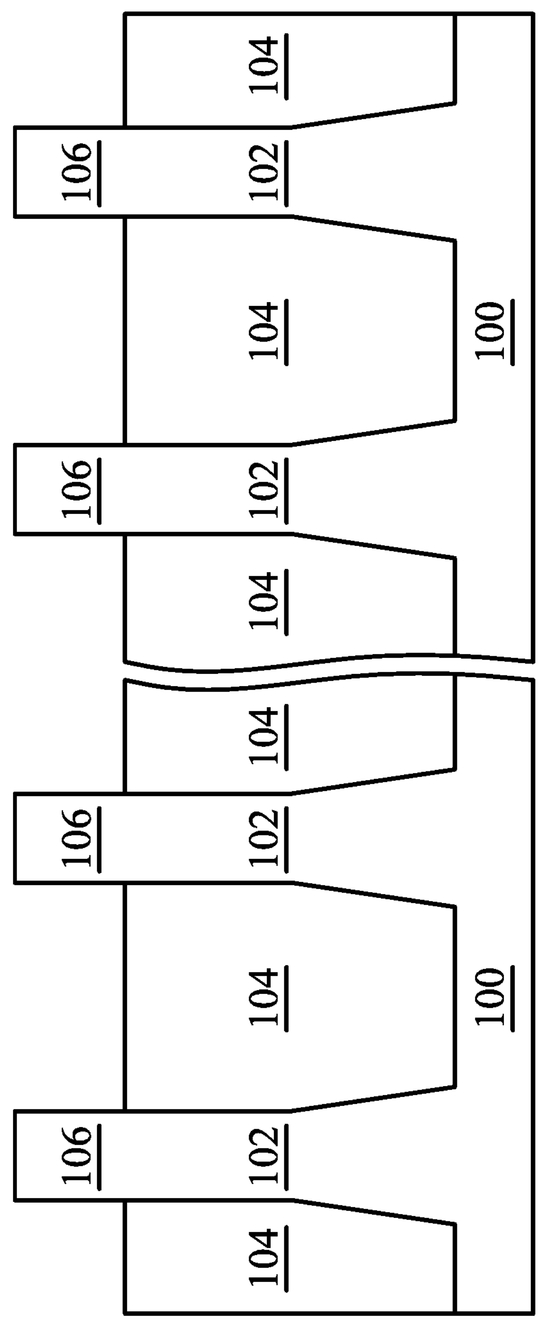
Figure 16C:
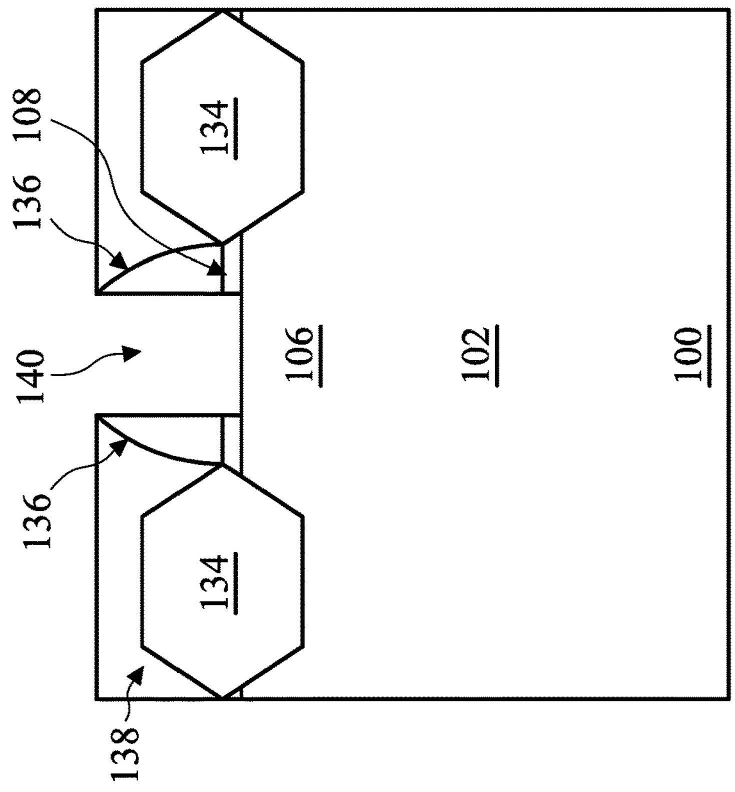
Figure 16B:
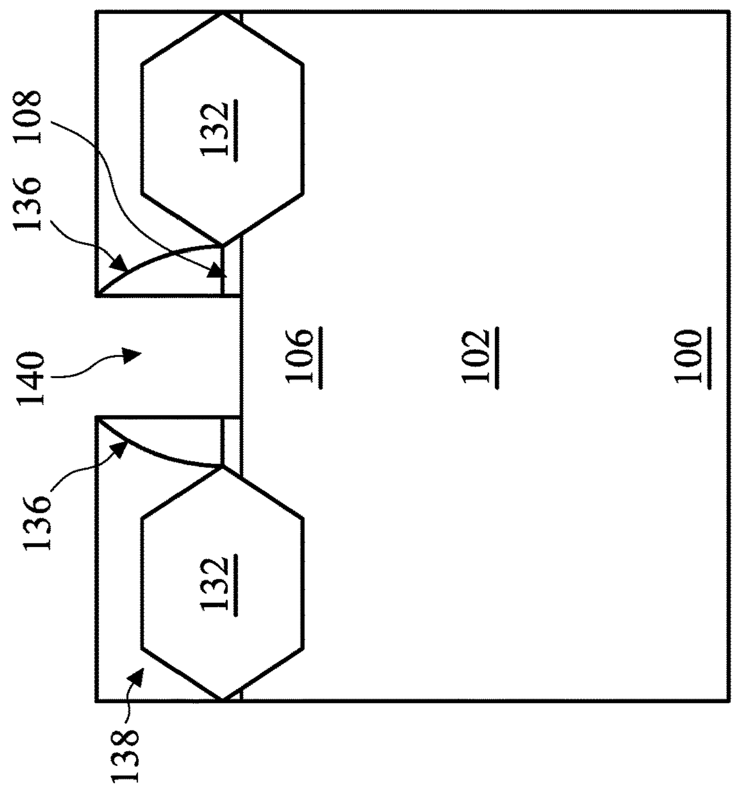

In FIGS. 16A, 16B, and 16C, the dummy gates 120 and 126, gate seal spacers 130, and portions of the dummy dielectric layer 108 directly underlying the dummy gates 120 and 126 are removed in an etching step(s), so that recesses 140 are formed. Each of the recesses 140 exposes a channel region of a respective one of the fins 106. Each channel region is disposed between neighboring pairs of epitaxial source/drain regions 132 and 134. During the removal, the dummy dielectric layer 108 may be used as an etch stop layer when the dummy gates 120 and 126 are etched. The dummy dielectric layer 108 and gate seal spacers 130 may then be removed after the removal of the dummy gates 120 and 126.

To begin the etching step(s) to recess and remove the dummy gates 120 and 126, the process may be started by placing the semiconductor wafer 10 onto the mounting platform 50, wherein the placement of the semiconductor wafer 10 is guided at least in part through the use of the edge ring 70 in order to align the semiconductor wafer 10 with the chuck 64. Once the semiconductor wafer 10 has been placed onto the chuck 64, the semiconductor wafer 10 may be attached to the chuck 64 using an attachment process. In an embodiment in which the chuck 64 is an electrostatic chuck, the semiconductor wafer 10 may be attached to the chuck 64 by applying a current to the lower electrode 52 such that electrostatic forces will apply a force to hold the semiconductor wafer 10 to the attachment surface of the chuck 64.

Once the semiconductor wafer 10 has been placed and is attached to the chuck 64, the controller 30 may initiate the etching process by connecting one or more of the etchant suppliers 32 and the carrier gas supply 34 to the etching chamber 24 to introduce a first etching combination of etchants. While the precise etchants utilized are dependent at least in part upon the materials chosen for the dummy gates 120 and 126, in an embodiment the first etching combination of etchants may comprise a combination of nitrogen trifluoride ($NF_3$) and hydrogen ($H_2$). In an embodiment the $H_2$ is introduced at a rate from about 40 sccm to about 5000 sccm, such as about 1250 sccm, and the $NF_3$ is introduced at a rate from about 10 sccm to about 500 sccm, such as about 350 sccm. However, any suitable etchant or combination of etchants and diluents may be utilized.

Within the etching chamber 24, the combination of etchants may be ignited into a plasma for a reactive ion etch process. In an embodiment the etching combination of etchants may be ignited by the controller 30 sending a signal to the upper RF generator 58 to supply to the upper electrode 56 a power from about 150 W to about 550 W, such as about 350 W. The controller 30 may also send a signal to the lower RF generator 54 in order to supply a bias to the lower electrode 52 within the chuck 64. In an embodiment the lower RF generator 54 supplies a bias from about 60 V to about 180 V, such as about 130 V.

By using the lower RF generator 54 to supply the bias to the lower electrode 52 within the chuck 64, an electric field and a sheath will be created over the surface of the semiconductor wafer 10 facing away from the chuck 64. The electric field and sheath will help move and accelerate ions from the plasma towards the surface to be etched (e.g., the dummy gates 120 and 126).

After the dummy gates 120 and 126 have been removed, the dummy dielectric layer 108 is exposed to the plasma generated within the etching chamber 24. In an embodiment in which the first etching combination of etchants will etch the dummy gates 120 and 126, the etching process may simply be continued to etch the dummy dielectric layer 108 without changing the first etching combination of etchants. In another embodiment, if desired, the first etching combination of etchants may be changed by the controller 30 connecting another one of the one or more of the etchant suppliers 32 and another carrier gas supply 34 to the etching chamber 24 to introduce a second etching combination of etchants. However, any suitable method may be utilized. If the combination of etchants is changed, the distance from the edge region 14 of the semiconductor wafer 10 to the edge ring 70 may be changed to control the etch rate at the edge region 14 with the new etchants.

By controlling the distance from the edge region 14 of the semiconductor wafer 10 to the edge ring 70, the etch rate at the edge region 14 may be controlled. By coating the edge ring 70 with one or more metals that are not solid phase catalysts of the etchants, the recombination rate of the etchants at the edge region 14 may be reduced. As such, a more uniform etching profile may be achieved when removing the dummy gates 120 and 126. In an embodiment, the dummy gates 120 and 126 may be formed with a height of about 790 Å. Etching the dummy gates 120 and 126 without controlling the etch rates at the edge region 14 may cause more of the ILD 138 in the central region 12 to be removed during etching than the edge region 14. This may cause the ILD 138 to have non-uniform height from the central region 12 to the edge region 14. Controlling the etch rate at the edge region 14 may reduce the amount of etching into the ILD 138 in the central region 12 by up to 40 Å.

Figure 17A:
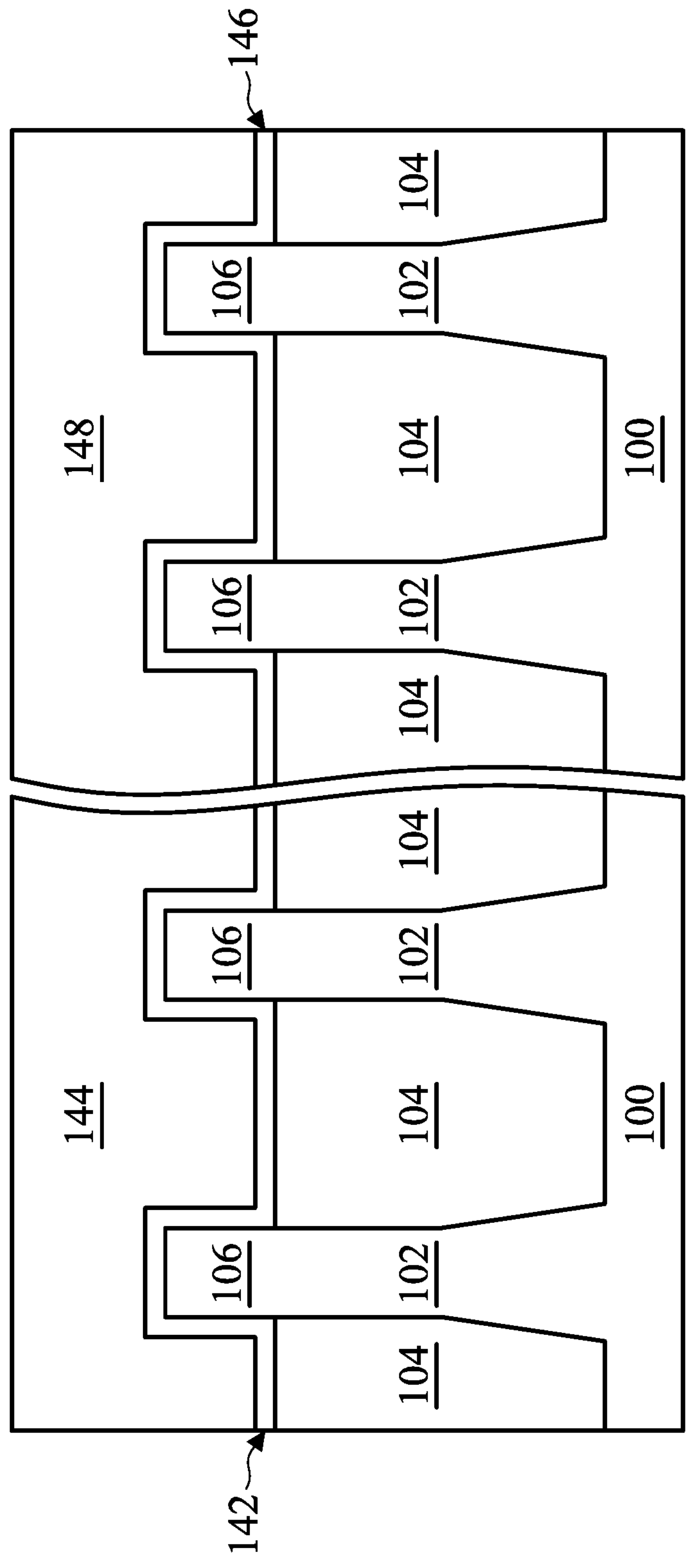
Figure 17C:
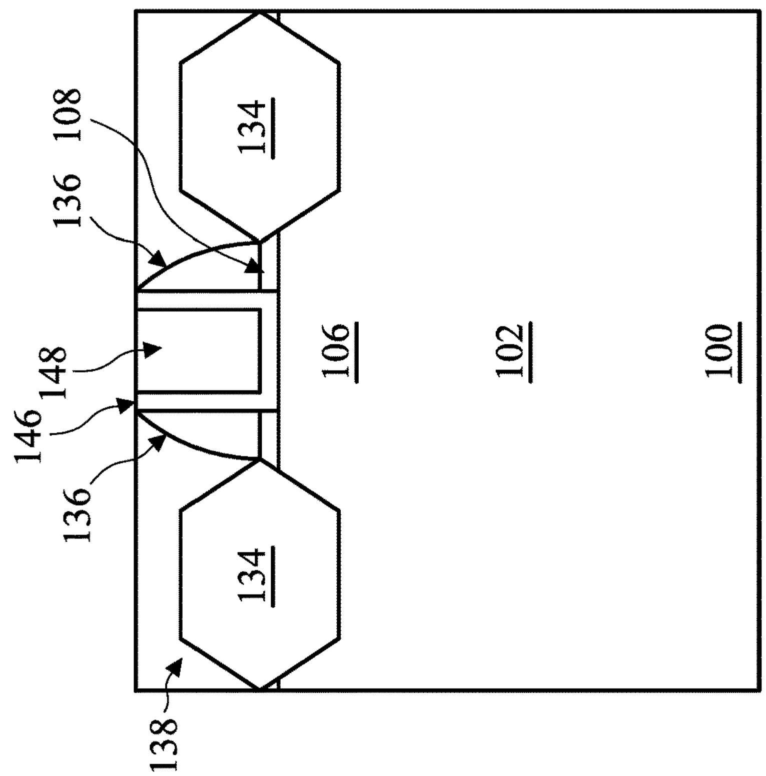
Figure 17B:
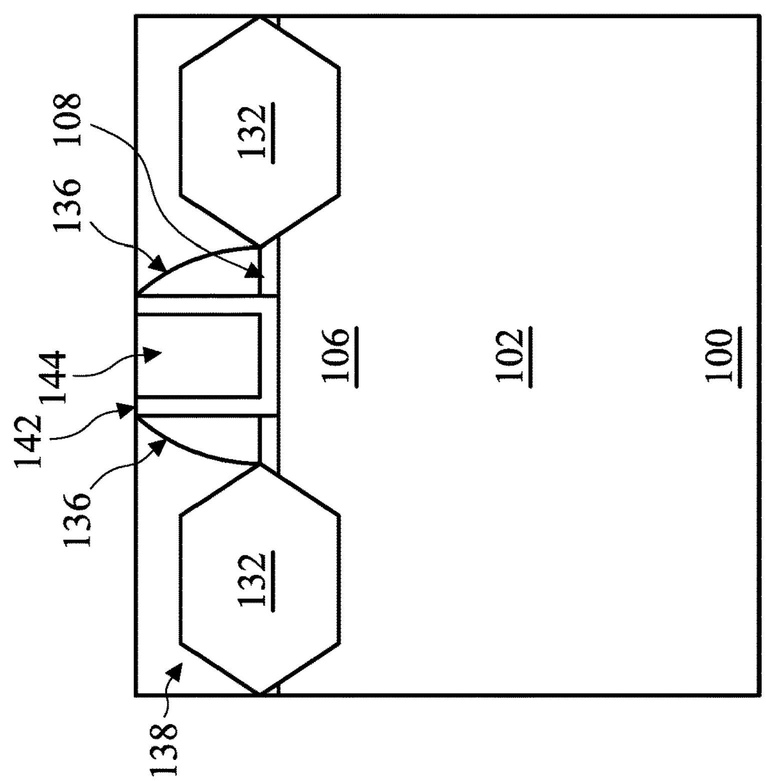

In FIGS. 17A, 17B, and 17C, gate dielectric layers 142 and 146 and gate electrodes 144 and 148 are formed for replacement gates. Gate dielectric layers 142 and 146 are deposited conformally in the recesses 140, such as on the top surfaces and the sidewalls of the fins 106 and on sidewalls of the gate spacers 136, and on a top surface of the ILD 138. In accordance with some embodiments, gate dielectric layers 142 and 146 comprise silicon oxide, silicon nitride, or multilayers thereof. In other embodiments, gate dielectric layers 142 and 146 include a high-k dielectric material, and in these embodiments, gate dielectric layers 142 and 146 may have a k value greater than about 7.0, and may include a metal oxide or a silicate of Hf, Al, Zr, La, Mg, Ba, Ti, Pb, and combinations thereof. The formation methods of gate dielectric layers 142 and 146 may include Molecular-Beam Deposition (MBD), Atomic Layer Deposition (ALD), PECVD, and the like.

Next, gate electrodes 144 and 148 are deposited over gate dielectric layers 142 and 146, respectively, and fill the remaining portions of the recesses 140. Gate electrodes 144 and 148 may be made of a metal-containing material such as TiN, TaN, TaC, Co, Ru, Al, W, combinations thereof, or multi-layers thereof. After the filling of gate electrodes 144 and 148, a planarization process, such as a CMP, may be performed to remove the excess portions of gate dielectric layers 142 and 146 and the material of gate electrodes 144 and 148, which excess portions are over the top surface of ILD 138. The resulting remaining portions of material of gate electrodes 144 and 148 and gate dielectric layers 142 and 146 thus form replacement gates of the resulting FinFETs, and may be collectively referred to as gate stacks.

The formation of the gate dielectric layers 142 and 146 may occur simultaneously such that the gate dielectric layers 142 and 146 are made of the same materials, and the formation of the gate electrodes 144 and 148 may occur simultaneously such that the gate electrodes 144 and 148 are made of the same materials. However, in other embodiments, the gate dielectric layers 142 and 146 may be formed by distinct processes, such that the gate dielectric layers 142 and 146 may be made of different materials, and the gate electrodes 144 and 148 may be formed by distinct processes, such that the gate electrodes 144 and 148 may be made of different materials. Various masking steps may be used to mask and expose appropriate regions when using distinct processes.

Figure 18A:
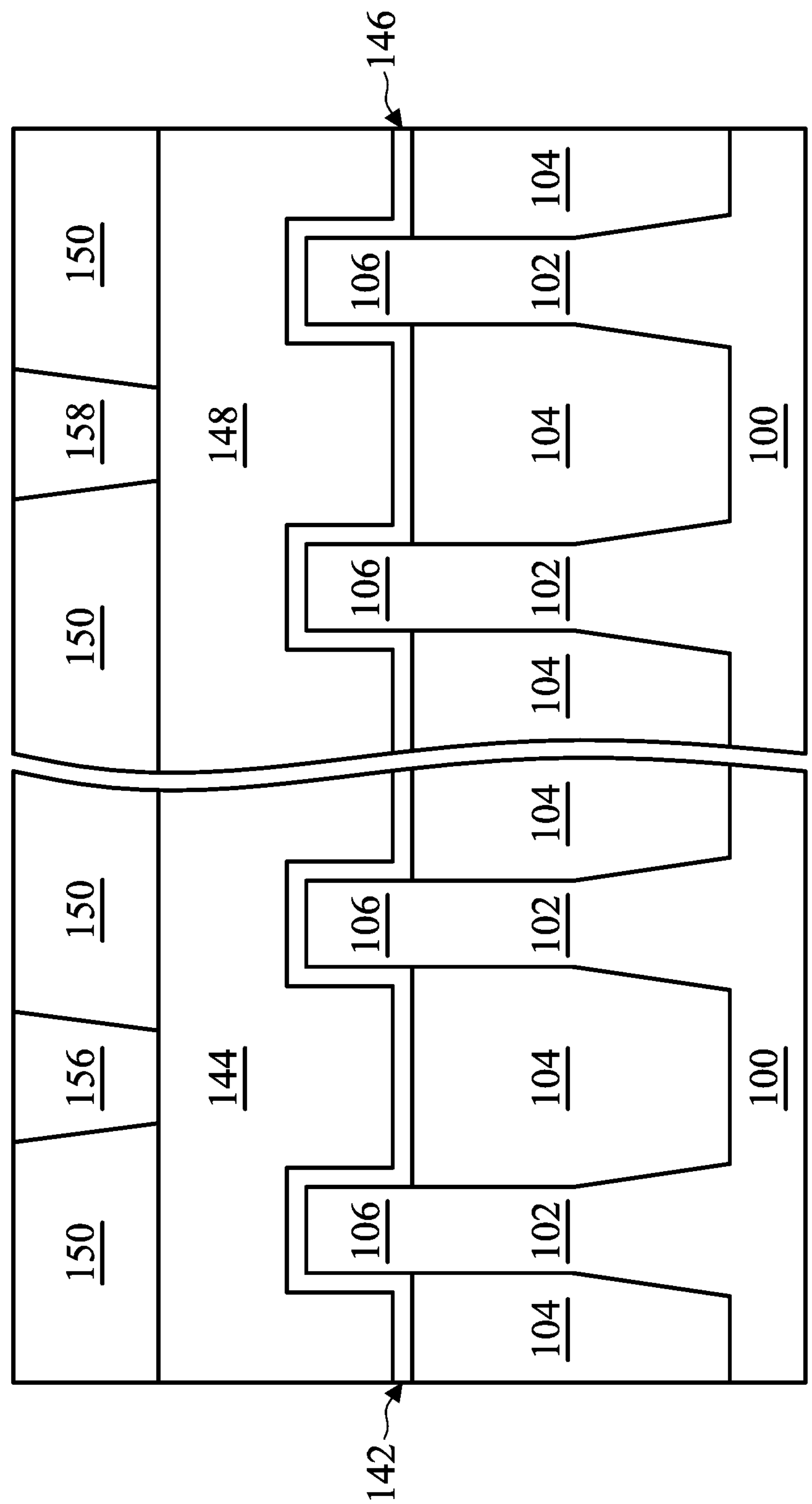
Figure 18C:
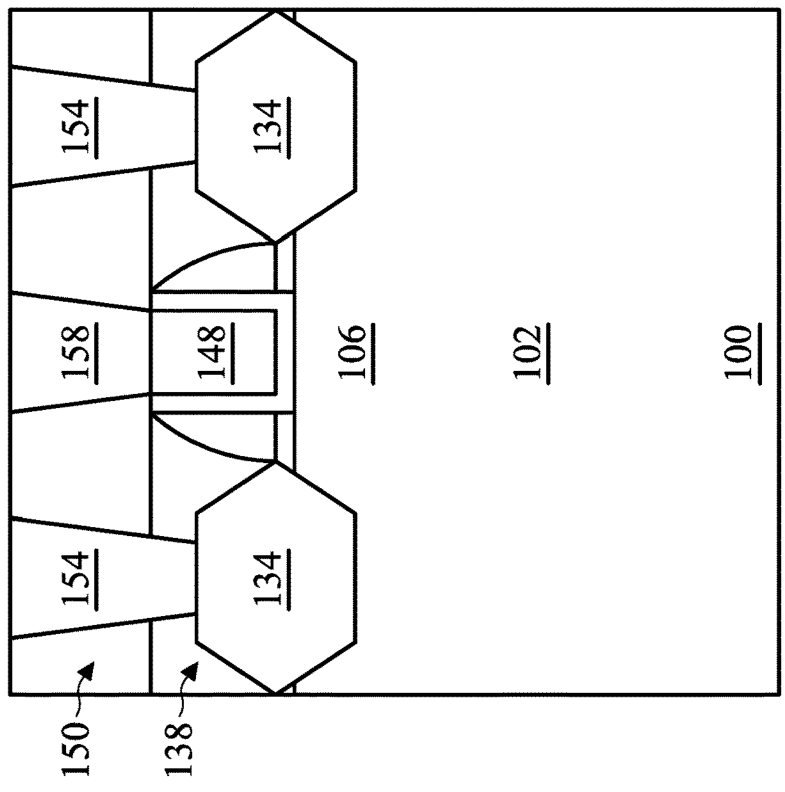
Figure 18B:
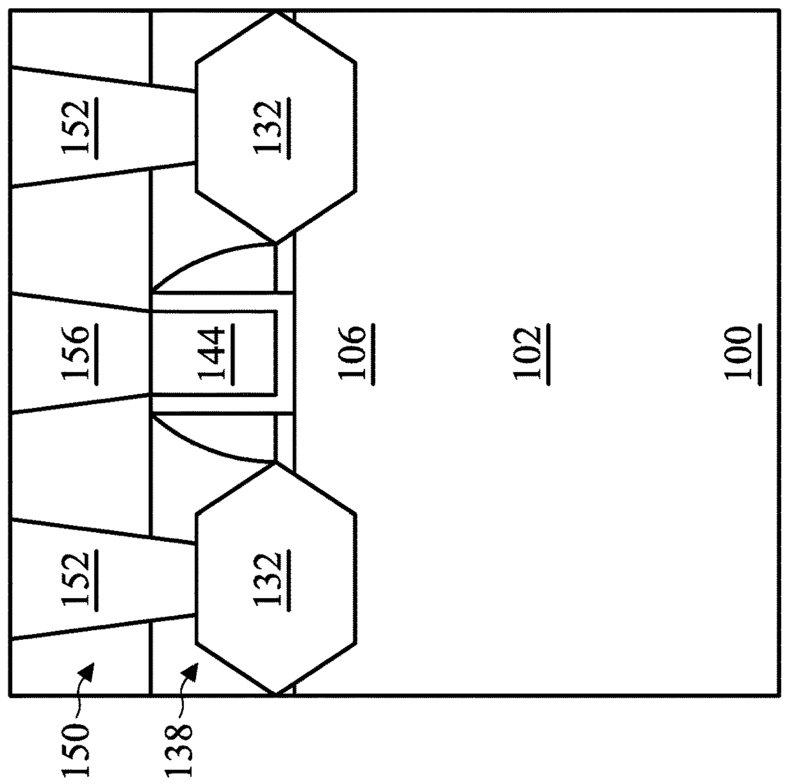

In FIGS. 18A, 18B, and 18C, an ILD 150 is deposited over the ILD 138. In an embodiment, the ILD 150 is a flowable film formed by a flowable CVD method. In some embodiments, the ILD 150 is formed of a dielectric material such as PSG, BSG, BPSG, USG, or the like, and may be deposited by any suitable method, such as CVD and PECVD.

Further in FIGS. 18A, 18B, and 18C, contacts 152 and 154 are formed through ILD 150 and ILD 138 and contacts 156 and 158 are formed through ILD 150. Openings for the contacts 152 and 154 are formed through the ILD 138 and 150. Openings for the contacts 156 and 158 are formed through the ILD 150. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 150. The remaining liner and conductive material form the contacts 152 and 154 in the openings. An anneal process may be performed to form a silicide at the interface between the epitaxial source/drain regions 132 and 134 and the contacts 152 and 154, respectively. The contacts 152 are physically and electrically coupled to the epitaxial source/drain regions 132, the contacts 154 are physically and electrically coupled to the epitaxial source/drain regions 134, the contact 156 is physically and electrically coupled to the gate electrode 144, and the contact 158 is physically and electrically coupled to the gate electrode 148.

In some embodiments, wires (not shown) may optionally be formed simultaneously with the contacts 152 and 154. The wires may couple the contacts 152 and 154 to other devices. In such embodiments, a hardmask is formed over the ILD 150, a dielectric layer is formed over the hardmask, and a silicon layer is formed over the dielectric layer. The silicon layer may be patterned, e.g., with a tri-layer lithography. A first etching process may be performed to form opening in the dielectric layer, the hardmask, and a first portion of the ILD 150. A second etching process may be performed using the patterned silicon layer as a mask to simultaneously extend the openings through the ILD 150 to expose the epitaxial source/drain regions 132, and form trenches in portions of the dielectric layer exposed by the patterned silicon layer. The conductive material may be formed in both the openings and the trenches, simultaneously forming the contacts 152 and 154 and the wires.

Embodiments may achieve advantages. By coating the edge ring with one or more metals that are not solid phase catalysts of the etchants, the recombination rate of the etchants at the edge region may be reduced or controller, controlling the etch rate at the edge region. Controlling the etch rate of the edge region of a wafer may allow a more uniform etching profile to be achieved across the wafer. Coating the edge ring in the processing device with one or more metals may reduce the rate of etchant recombination. In an example, the difference in total height etched between the central region and the edge region of a wafer was reduced from about 17.22 Å to about 9.27 Å. The 3-sigma from mean difference in total etching was reduced from about 35% to about 18% across the wafer.

An embodiment semiconductor manufacturing tool includes: push pins in a chuck configured to hold a wafer, the push pins operable to vary a height of the wafer with respect to the chuck; and an edge ring over the chuck, the edge ring having a first width at a base proximate the chuck, the edge ring having a second width at a point distal the chuck, the first width greater than the second width, a distance from the wafer to the edge ring varying when the push pins vary the height of the wafer with respect to the chuck.

An embodiment method includes: forming devices on a central region of a wafer and an edge region of the wafer; and etching features of the devices, the etching simultaneously recessing the features of the devices at the central region and the edge region of the wafer at a substantially similar rate.

An embodiment method includes: forming a first semiconductor fin on a center region of a wafer and a second semiconductor fin on an edge region of the wafer; forming a first dummy gate on the first semiconductor fin and a second dummy gate on the second semiconductor fin; forming first source/drain regions adjacent the first dummy gate and second source/drain regions adjacent the second dummy gate; forming an inter-layer dielectric (ILD) over the wafer, the ILD being adjacent the first dummy gate and the second dummy gate; and simultaneously removing the first dummy gate and the second dummy gate with a combination of etchants, the combination of etchants etching the first dummy gate and the second dummy gate at substantially similar rates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming devices on a central region of a wafer and an edge region of the wafer;
- placing the wafer on a mounting platform, the mounting platform including push pins and a stepped edge ring; and
- etching features of the devices while varying a height of the wafer over the mounting platform with the push pins, a distance between the wafer and the stepped edge ring varying proportionally with the height of the wafer over the mounting platform, the etching simultaneously recessing the features of the devices at the central region and the edge region of the wafer at a substantially similar rate.

2. The method of claim 1, wherein the devices are Fin Field-Effect Transistors (FinFETs) and the features are dummy gates of the FinFETs, the dummy gates of the FinFETs being adjacent inter-layer dielectrics (ILDs).

3. The method of claim 2, wherein heights of the ILDs at the at the central region of the wafer and heights of the ILDs at the at the edge region of the wafer differ by less than 10 Å.

4. The method of claim 1, wherein the difference between an etch rate of the features of the devices at the central region and an etch rate of the features of the devices at the edge region is less than about 20%.

5. The method of claim 1, wherein varying the height of the wafer over the mounting platform varies an etch rate of the features of the devices at the edge region of the wafer.

6. A method comprising:
- forming a first semiconductor fin on a center region of a wafer and a second semiconductor fin on an edge region of the wafer;
- forming a first dummy gate on the first semiconductor fin and a second dummy gate on the second semiconductor fin;
- forming first source/drain regions adjacent the first dummy gate and second source/drain regions adjacent the second dummy gate;
- forming an inter-layer dielectric (ILD) over the wafer, the ILD being adjacent the first dummy gate and the second dummy gate;
- placing the wafer on a mounting platform, the wafer surrounded by an edge ring on the mounting platform;
- simultaneously removing the first dummy gate and the second dummy gate with a combination of etchants, the combination of etchants etching the first dummy gate and the second dummy gate at substantially similar rates; and
- while removing the first dummy gate and the second dummy gate, varying a distance between the edge region of the wafer and the edge ring.

7. The method of claim 6, wherein simultaneously removing the first dummy gate and the second dummy gate comprises:
- dispensing the combination of etchants on a surface of the wafer.

8. The method of claim 7, wherein a material of the edge ring is not a solid phase catalyst for the combination of etchants.

9. The method of claim 6, wherein the first dummy gate is proximate the edge ring on the mounting platform, the second dummy gate being distal the edge ring on the mounting platform, and further comprising:

adjusting a height of the wafer over the mounting platform, a distance between the first dummy gate and the edge ring being directly proportional to the height of the wafer.

10. A method comprising:

forming a first semiconductor fin on a center region of a wafer and a second semiconductor fin on an edge region of the wafer;

forming a first dummy gate on the first semiconductor fin and a second dummy gate on the second semiconductor fin;

placing the wafer on push pins disposed partially in slots in a chuck, the wafer surrounded by an edge ring;

etching the first dummy gate and the second dummy gate with a combination of etchants; and while etching the first dummy gate and the second dummy gate, moving the push pins in the slots to vary a height of the wafer with respect to the chuck, a distance from the wafer to the edge ring in a direction parallel to a major surface of the wafer varying when the push pins vary the height of the wafer with respect to the chuck.

11. The method of claim 10, wherein the edge ring has a first width at a base proximate the chuck and a second width at a point distal the chuck, the first width greater than the second width.

12. The method of claim 10, wherein the distance between the wafer and the edge ring varies proportionally with the height of the wafer.

13. The method of claim 10, wherein a material of the edge ring is not a solid phase catalyst for the combination of etchants.

14. The method of claim 10, wherein the moving the push pins in the slots increases the distance from the wafer to the edge ring.

15. The method of claim 10, wherein the moving the push pins in the slots decreases the distance from the wafer to the edge ring.

16. The method of claim 10, wherein the edge ring has a graded side, the distance from the wafer to the graded side of the edge ring varying with the height of the wafer with respect to the chuck.

17. The method of claim 16, wherein the graded side has a plurality of steps.

18. The method of claim 16, wherein the graded side is sloped.

19. The method of claim 10, wherein the edge ring has an inner diameter and an outer diameter, the outer diameter equal to a diameter of the chuck, the inner diameter less than a diameter of the wafer.

20. The method of claim 1, wherein the edge ring comprises a main structure coated with a first material, and wherein etching the features of the devices comprises:

dispensing a combination of etchants on a surface of the wafer, wherein the first material is not a solid phase catalyst for the combination of etchants.

* * * * *